(12) United States Patent
Lim et al.

(10) Patent No.: US 12,161,015 B2
(45) Date of Patent: Dec. 3, 2024

(54) DISPLAY DEVICE

(71) Applicant: Samsung Display Co., Ltd., Yongin-si (KR)

(72) Inventors: Ho Lim, Suwon-si (KR); Taemin Kim, Hwaseong-si (KR); Bongsung Seo, Suwon-si (KR); Donggeun Shin, Hwaseong-si (KR); Gihoon Yang, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 572 days.

(21) Appl. No.: 17/477,559

(22) Filed: Sep. 17, 2021

(65) Prior Publication Data

US 2022/0181589 A1   Jun. 9, 2022

(30) Foreign Application Priority Data

Dec. 8, 2020   (KR) .................. 10-2020-0170133

(51) Int. Cl.
| | |
|---|---|
| *H10K 50/86* | (2023.01) |
| *G02B 1/115* | (2015.01) |
| *H01L 25/065* | (2023.01) |
| *H10K 59/38* | (2023.01) |
| *H10K 85/40* | (2023.01) |
| *H10K 102/00* | (2023.01) |

(52) U.S. Cl.
CPC ............ *H10K 50/86* (2023.02); *G02B 1/115* (2013.01); *H01L 25/0655* (2013.01); *H10K 59/38* (2023.02); *H10K 85/40* (2023.02); *H10K 2102/351* (2023.02)

(58) Field of Classification Search
None
See application file for complete search history.

(56) References Cited

U.S. PATENT DOCUMENTS

| | | |
|---|---|---|
| 9,093,650 B2 | 7/2015 | Kim et al. |
| 10,326,111 B2 | 6/2019 | Yoo et al. |
| 2009/0052041 A1 | 2/2009 | Watanabe et al. |
| 2017/0018600 A1 | 1/2017 | Ito et al. |
| 2017/0200899 A1 | 7/2017 | Kim et al. |

(Continued)

FOREIGN PATENT DOCUMENTS

| | | | | |
|---|---|---|---|---|
| CN | 116137784 A | * | 5/2023 | ......... H01L 27/3227 |
| CN | 116367652 A | * | 6/2023 | ........... H01L 27/322 |

(Continued)

*Primary Examiner* — Michael Lebentritt
(74) *Attorney, Agent, or Firm* — KILE PARK REED & HOUTTEMAN PLLC

(57) ABSTRACT

A display device includes: a light emitting element layer; a color control layer disposed on the light emitting element layer and including at least one quantum dot; a color filter layer disposed on the color control layer; and an anti-reflection member disposed on the color filter layer, the anti-reflection member including: a first coating layer disposed on the color filter layer; a second coating layer disposed on the first coating layer; and an inorganic film disposed between the first coating layer and the second coating layer, wherein the second coating layer has a thickness of about 0.6 times to about 2.0 times greater than the inorganic film, and the first coating layer having a greater thickness than the second coating layer and the inorganic film.

27 Claims, 7 Drawing Sheets

(56) References Cited

U.S. PATENT DOCUMENTS

| | | |
|---|---|---|
| 2019/0284137 A1 | 9/2019 | Baek et al. |
| 2019/0312210 A1 | 10/2019 | Akashi et al. |
| 2019/0375768 A1 | 12/2019 | Kim et al. |
| 2020/0106024 A1 | 4/2020 | Seo et al. |
| 2020/0212122 A1* | 7/2020 | Asaoka ................ H10K 59/50 |
| 2024/0057439 A1* | 2/2024 | Lee ..................... H10K 59/873 |
| 2024/0172540 A1* | 5/2024 | Bae ....................... G02B 1/115 |

FOREIGN PATENT DOCUMENTS

| | | |
|---|---|---|
| JP | 5076729 | 11/2012 |
| KR | 10-2008-0055699 | 6/2008 |
| KR | 10-2011-0024984 | 3/2011 |
| KR | 10-1246022 | 4/2013 |
| KR | 10-2021-0134206 | 11/2021 |

\* cited by examiner

DISPLAY DEVICE

CROSS-REFERENCE TO RELATED APPLICATIONS

This application claims priority from and the benefit of Korean Patent Application No. 10-2020-0170133, filed on Dec. 8, 2020, which is hereby incorporated by reference for all purposes as if fully set forth herein.

BACKGROUND

Field

Embodiments of the invention relate generally to a display device, and more particularly, to a display device including an anti-reflection member.

Discussion of the Background

Various types of display devices are being used in order to provide image information. An exterior of such display devices is required to be equipped with high surface hardness and impact resistance to protect the display devices from the outside environment and ensure reliability against repetitive use.

In addition, exposure of the display devices to external light such as various types of lighting and natural light may fail to clearly convey images of the display devices to users due to reflected light, or cause the users to suffer fatigue. For this reason, there is a demand for an anti-reflection function for the display devices.

The above information disclosed in this Background section is only for understanding of the background of the inventive concepts, and, therefore, it may contain information that does not constitute prior art.

SUMMARY

Display devices constructed according to exemplary implementations of the invention are capable of providing a display device exhibiting satisfactory reflectance.

Additional features of the inventive concepts will be set forth in the description which follows, and in part will be apparent from the description, or may be learned by practice of the inventive concepts.

According to one aspect of the invention, a display device includes: a light emitting element layer; a color control layer disposed on the light emitting element layer and including at least one quantum dot; a color filter layer disposed on the color control layer; and an anti-reflection member disposed on the color filter layer, the anti-reflection member including: a first coating layer disposed on the color filter layer; a second coating layer disposed on the first coating layer; and an inorganic film disposed between the first coating layer and the second coating layer, wherein the second coating layer has a thickness of about 0.6 times to about 2.0 times greater than the inorganic film, and the first coating layer having a greater thickness than the second coating layer and the inorganic film.

According to another aspect of the invention, a display device including at least one display panel, the at least one display panel includes: a light emitting element layer; an encapsulation layer disposed on the light emitting element layer; a color control layer directly disposed on the encapsulation layer and including at least one quantum dot; a color filter layer disposed on the color control layer; and an anti-reflection member disposed on the color filter layer, the anti-reflection member including: a first coating layer disposed on the color filter layer; a second coating layer disposed on the first coating layer; and an inorganic film disposed between the first coating layer and the second coating layer, wherein the second coating layer has a thickness of about 0.6 times to about 2.0 times greater than the inorganic film, and the first coating layer has a greater thickness than the second coating layer and the inorganic film.

According to a further aspect of the invention, a display device includes: a light emitting element layer; a color control layer disposed on the light emitting element layer and including at least one quantum dot; a color filter layer disposed on the color control layer; and an anti-reflection member disposed on the color filter layer, wherein the anti-reflection member including: a first coating layer disposed on the color filter layer; a second coating layer disposed on the first coating layer; and an inorganic film disposed between the first coating layer and the second coating layer, wherein the first coating layer and the second coating layer each, independently from one another, including at least one repeat unit among first to fourth repeat units, as defined herein.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
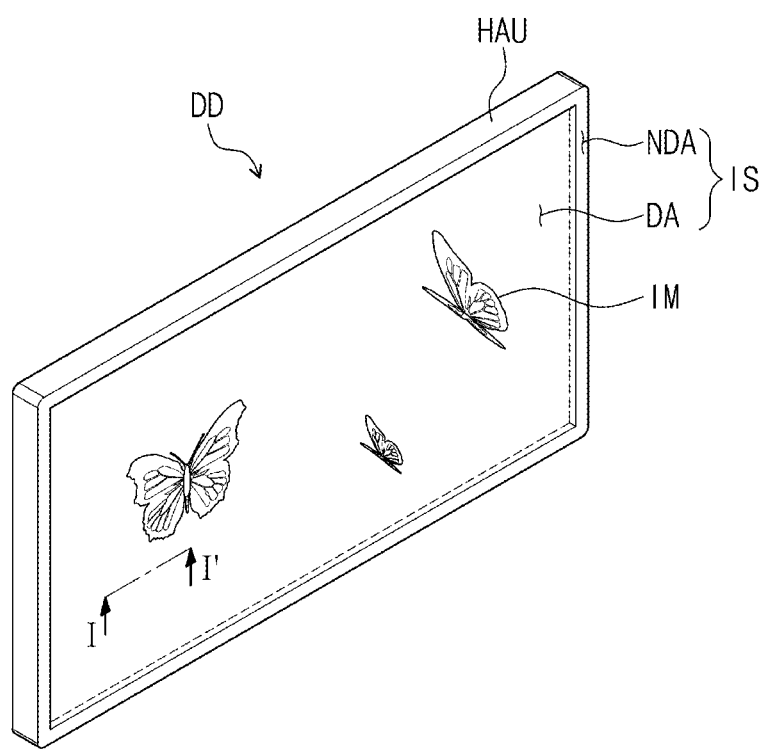
FIG. 1 is a perspective view of an embodiment of a display device.
Figure 1:
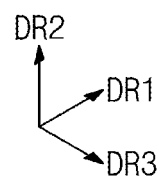

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, portions, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, combinations, and/or groups thereof, but do not preclude the presence or addition of one or more other features, integers, steps, operations, elements, components, combinations, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an embodiment will be described with reference to the accompanying drawings.

Figure 2:
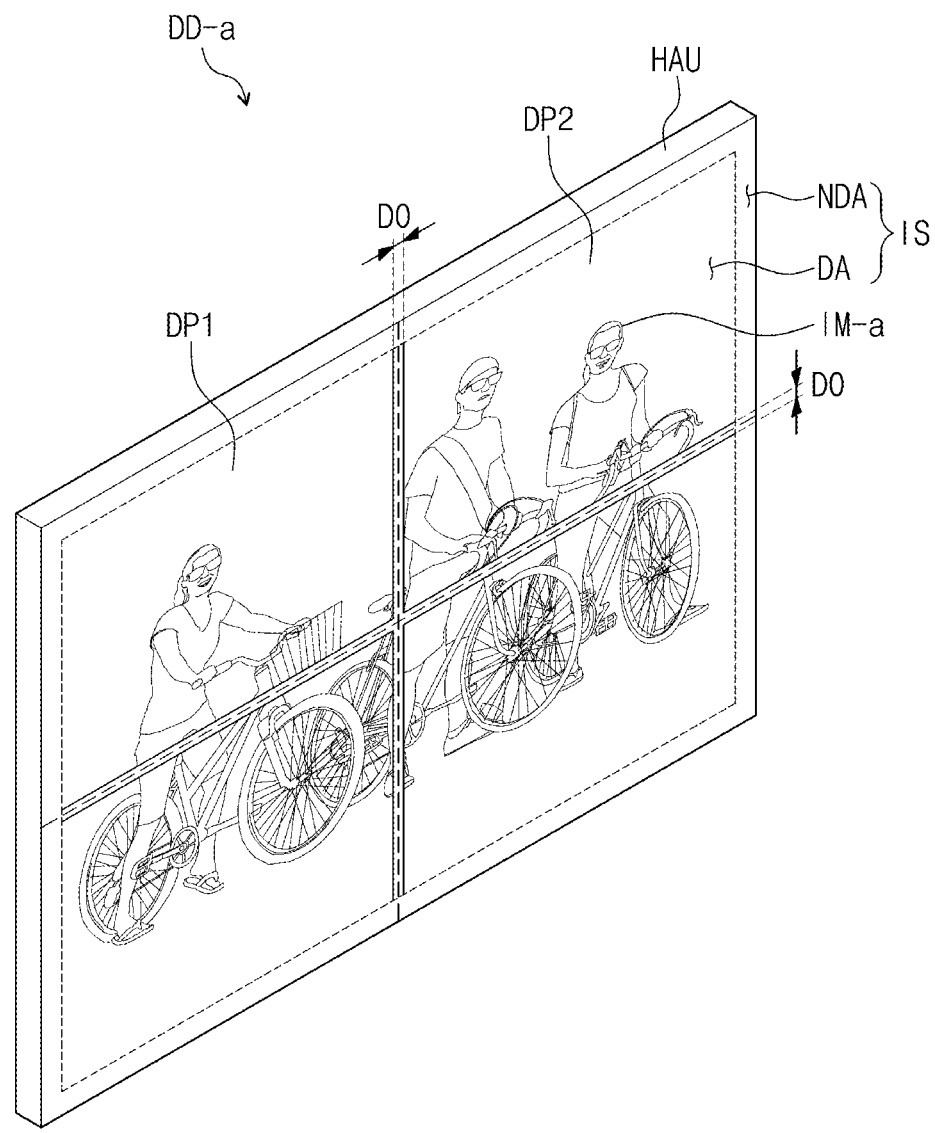
FIG. 2 is a perspective view of another embodiment of a display device.
Figure 2:
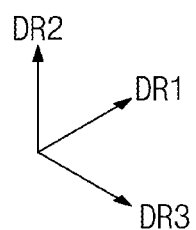
Figure 3:
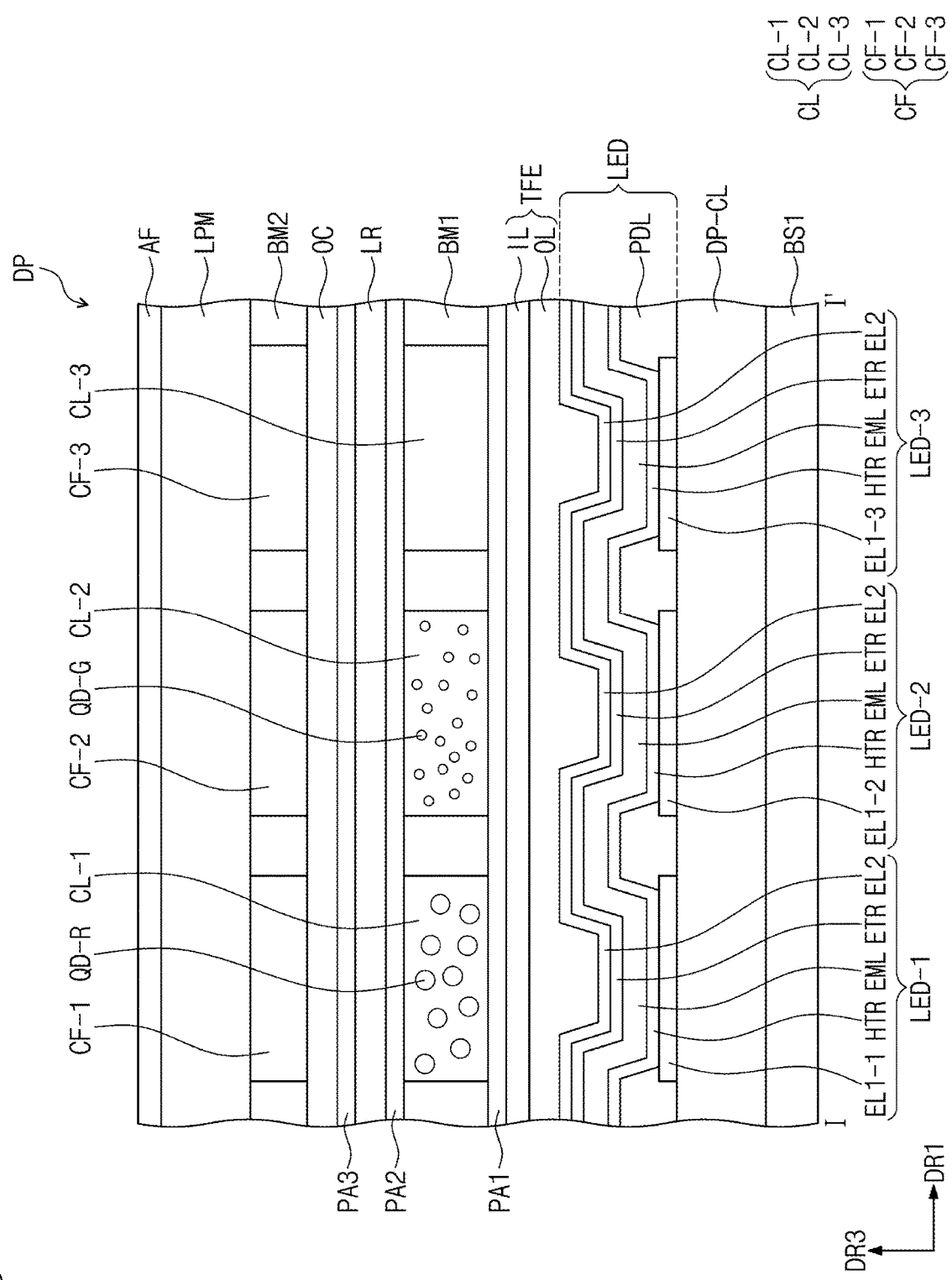
FIG. 3 is a cross-sectional view illustrating a portion taken along line I-I' of FIG.
Figure 4:
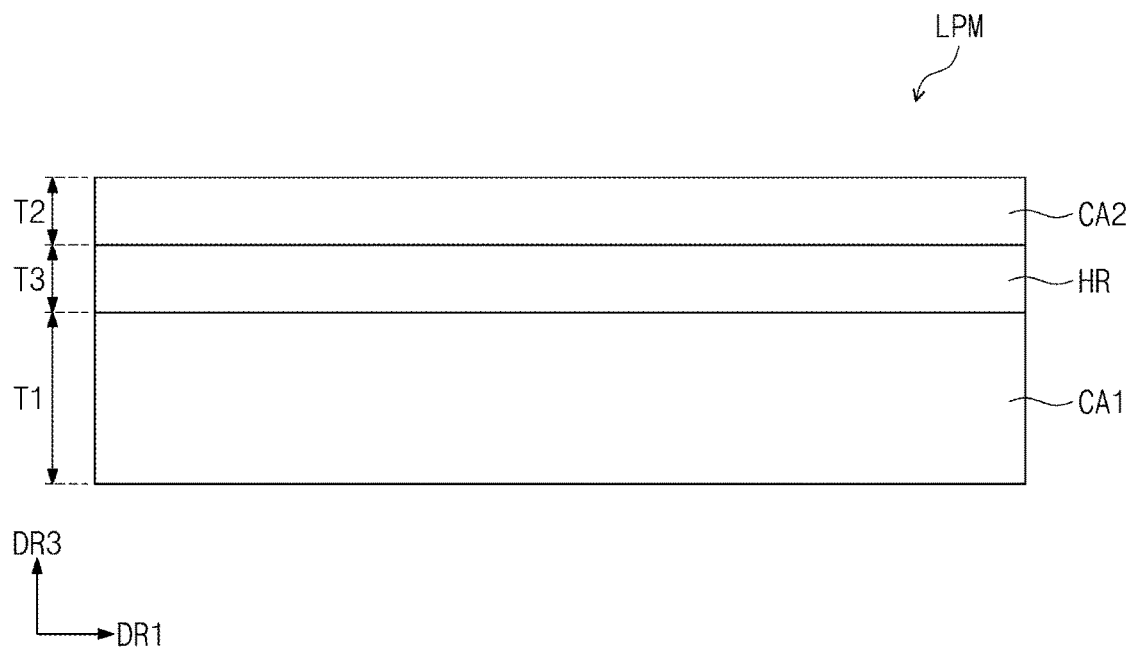
FIG. 4 is a cross-sectional view illustrating an embodiment of a portion of a display device.
Figure 5:
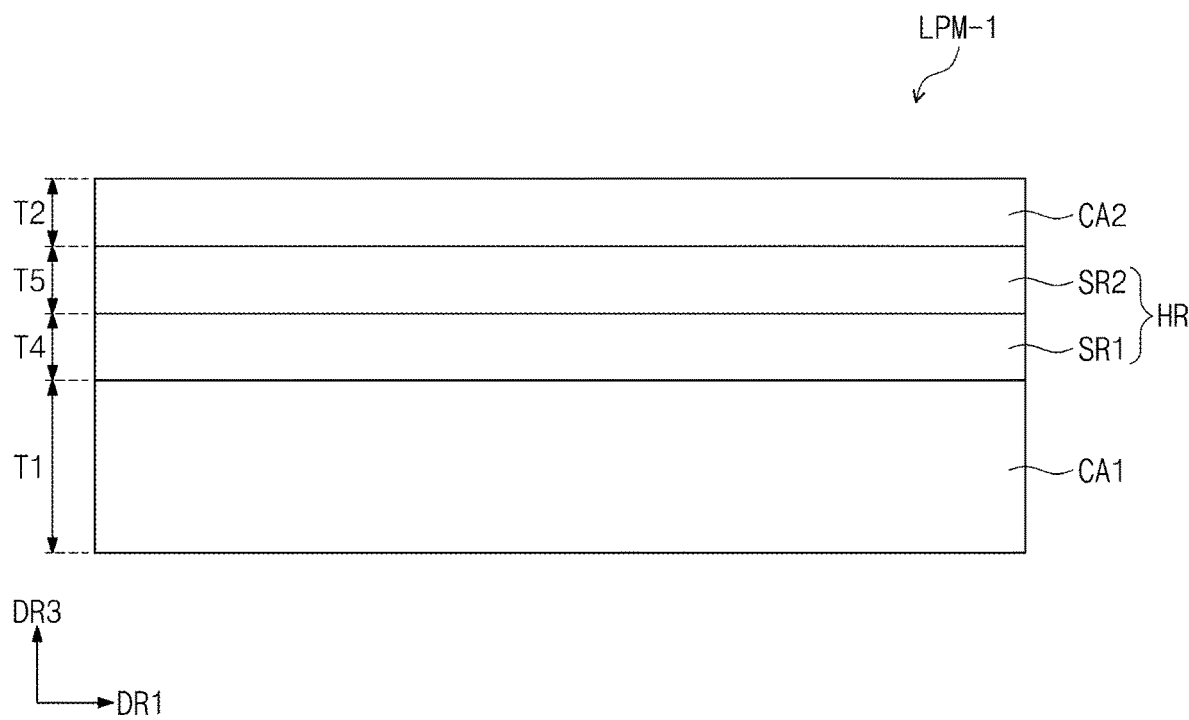
FIG. 5 is a cross-sectional view illustrating another embodiment of a portion of a display device.

FIG. 1 is a perspective view of an embodiment of a display device. FIG. 2 is a perspective view of another embodiment of a display device. FIG. 3 is a cross-sectional view illustrating a portion taken along line I-I' of FIG. 1. FIG. 4 is a cross-sectional view illustrating an embodiment of a portion of a display device. Particularly, FIG. 4 is a cross-sectional view showing an anti-reflection member LPM of FIG. 3 in more detail. FIG. 5 is a cross-sectional view illustrating another embodiment of a portion of a display device.

A display device DD may be a large-sized electronic device such as a television set, a monitor, or an outdoor billboard. However, these are merely presented as an example, and thus the display device DD may be adopted for other electronic devices without departing from the inventive concepts. The display device DD of an embodiment may include a light emitting element layer LED (FIG. 3), a color control layer CL (FIG. 3), a color filter layer CF (FIG. 3), and an anti-reflection member LPM (FIG. 3), which are sequentially stacked. The anti-reflection member LPM (FIG. 4) may include a first coating layer CA1, an inorganic film HR, and a second coating layer CA2, which are sequentially stacked.

A display surface IS of the display device DD may correspond to a display area DA and a non-display area NDA. The display device DD may include the display area DA in which an image IM is displayed, and the non-display area NDA surrounding the display area DA. The display area DA in which the image IM is displayed may be substantially parallel to a plane defined by a first directional axis DR1 and a second directional axis DR2 crossing the first directional axis DR1. The non-display area NDA may be an area in which the image IM is not displayed. The non-display area NDA may be omitted in the display device DD according to an embodiment.

FIG. 2 illustrates a display device DD-a according to another embodiment of the inventive concepts, and unlike FIG. 1, FIG. 2 illustrates that the display device DD-a includes a plurality of display panels DP1 and DP2. The descriptions of the display device DD in FIG. 1 may be equally applied to the display device DD-a in FIG. 2. The display device DD-a according to an embodiment may be a tiling display including the plurality of display panels DP1 and DP2.

In the display device DD-a, the plurality of display panels DP1 and DP2 may be disposed adjacent to each other on a plane. Display surfaces of the plurality of display panels DP1 and DP2 may constitute the display surface IS of the display device DD-a. In the display device DD-a including the plurality of display panels DP1 and DP2, the display panels DP1 and DP2 each may display separate images. The separate images displayed on each of the display panels DP1 and DP2 may constitute one connected image IM-a. The one connected image IM-a may be displayed to users through the display device DD-a.

In the display device DD-a according to an embodiment, a minimum distance DO between the display panels DP1 and DP2 may be about 30 μm or less. The minimum distance DO between the display panels DP1 and DP2 including the anti-reflection member LPM (FIGS. 2 and 3) according to an embodiment which will be described below may be about 30 μm or less. The minimum distance DO is a minimum distance between adjacent display panels DP1 and DP2, and may be a linear distance on a plane. As an example, the minimum distance DO may be a minimum linear distance from one side of one display panel DP1 to the other side of another display panel DP2. As a further example, the minimum distance DO may correspond to tolerance between the display panels DP1 and DP2.

FIG. 2 illustrates the minimum distance DO between the display panels DP1 and DP2, but the minimum distance DO may be close to zero. The minimum distance DO may not be viewed by users using the display device DD-a, and the image IM-a displayed on the display panels DP1 and DP2 may be viewed as being integral. Accordingly, the display device DD according to an embodiment may exhibit improved display quality.

In the display devices DD and DD-a, the display panels DP1 and DP2 may be accommodated in a housing HAU. The housing HAU may be disposed to cover the display panels DP1 and DP2 such that an upper surface, which is the display surface of the display panels DP1 and DP2, is exposed. The housing HAU may cover a side surface and a bottom surface of the display panels DP1 and DP2, and expose the whole upper surface.

In addition, the display devices DD and DD-a may have a three-dimensional shape having a predetermined thickness in a direction of the third directional axis DR3, which is a direction substantially perpendicular to a plane defined by the first directional axis DR1 and the second directional axis DR2 crossing the first directional axis DR1. An upper surface (or a front surface) and a lower surface (or a rear surface) of respective members are defined with respect to a direction in which an image is displayed in the display area DA. The upper surface and the lower surface may oppose each other with respect to the third directional axis DR3 and a normal direction of each of the upper and lower surfaces may be substantially parallel to the third directional axis DR3. The directions indicated by the first to third directional axes DR1, DR2, and DR3 are relative concepts, and may thus be changed to other directions. Hereinafter, first to third directions correspond to directions indicated by the first to third directional axes DR1, DR2, and DR3, respectively, and are given the same reference numerals.

FIG. 3 is a cross-sectional view of a display panel DP according to an embodiment. FIGS. 4 and 5 are cross-sectional views showing a portion of the display device DD according to an embodiment. To be more specific, FIGS. 4 and 5 illustrate anti-reflection members LPM and LPM-1 according to an embodiment. The anti-reflection member LPM-1 of FIG. 5 shows another embodiment.

The display device DD according to an embodiment may include at least one display panel DP. In an embodiment, two or more display panels DP may be provided. The two or more display panels DP1 and DP2 may be disposed adjacent to each other on a plane. The display panels DP1 and DP2 each may be the same as the display panel DP of FIG. 3. The description of the display panel DP in FIG. 3 may be equally applied to the plurality of display panels DP1 and DP2 shown in FIG. 2.

In an embodiment, the display panel DP may include a light emitting element layer LED, a color control layer CL disposed on the light emitting element layer LED, a color filter layer CF disposed on the color control layer CL, and anti-reflection members LPM and LPM-1 disposed on the color filter layer CF. The anti-reflection member LPM may include a first coating layer CA1 disposed on the color filter layer CF, a second coating layer CA2 disposed on the first coating layer CA1, and an inorganic film HR disposed between the first coating layer CA1 and the second coating layer CA2. A thickness T2 of the second coating layer CA2 may be about 0.6 times to about 2.0 times greater than a thickness T3 of the inorganic film HR. In addition, a thickness T1 of the first coating layer CA1 may be greater than the thickness T2 of the second coating layer CA2 and the thickness T3 of the inorganic film HR.

The light emitting element layer LED may be disposed on a circuit layer DP-CL. An encapsulation layer TFE may be disposed on the light emitting element layer LED, and the color control layer CL may be disposed on the encapsulation layer TFE. A buffer layer may be further disposed between the encapsulation layer TFE and the color control layer CL. The color control layer CL may include one or more quantum dots QD-G and/or QD-R.

Referring to FIG. 3, the display panel DP may include a base layer BS1. The base layer BS1 may be a polymer substrate, a plastic substrate, a glass substrate, a quartz substrate, etc. The base layer BS1 may be a transparent insulating substrate. The base layer BS1 may be rigid or flexible.

The circuit layer DP-CL may be disposed on the base layer BS1. The circuit layer DP-CL may include a plurality of transistors. The transistors each may include a control electrode, an input electrode, and an output electrode. For example, the circuit layer DP-CL may include a switching transistor and a driving transistor for driving a plurality of light emitting elements LED-1, LED-2 and LED-3.

The light emitting element layer LED may be disposed on the circuit layer DP-CL. The light emitting element layer LED may include first to third light emitting elements LED-1, LED-2, and LED-3. The first to third light emitting elements LED-1, LED-2, and LED-3 each may include a first electrodes EL1-1, EL1-2, and EL1-3, a hole transport region HTR, an emission layer EML, an electron transport region ETR, and a second electrode EL2, which are sequentially stacked. The light emitting elements LED-1, LED-2, and LED-3 each may include a plurality of emission layers. Each of the light emitting elements LED-1, LED-2, and LED-3 may be a light emitting element having a tandem structure including the plurality of emission layers disposed between the first electrodes EL1-1, EL1-2, and EL1-3 and the second electrode EL2, which face each other.

The emission layer EML may generate blue light. The light emitting element layer LED may emit blue light. The emission layer EML may generate light in a wavelength of about 410 nanometer (nm) to about 480 nm. The emission layer EML may include an organic material or an inorganic material. For example, the emission layer EML may include a quantum dot material. In addition, the emission layer EML may include a host and a dopant for fluorescence. Alternatively, the emission layer EML may include a host and a dopant for phosphorescence. However, the materials included in the emission layer EML in this example are not limited thereto.

A pixel defining film PDL may be defined in the light emitting element layer LED. For example, the pixel defining film PDL may be formed including a polyacrylate-based resin or a polyimide-based resin. Alternatively, the pixel defining film PDL may be formed of an inorganic material. For example, the pixel defining film PDL may be formed including a silicon nitride, a silicon oxide, a silicon oxynitride, etc. In the light emitting element layer LED, the light emitting elements LED-1, LED-2, and LED-3 may be separated by the pixel defining film PDL.

The encapsulation layer TFE may be disposed on the light emitting element layer LED to seal the light emitting element layer LED. The encapsulation layer TFE may serve to protect the light emitting element layer LED from moisture and/or oxygen, and protect the light emitting element layer LED from foreign substances, such as dust particles. FIG. 2 illustrates that the encapsulation layer TFE includes one organic layer OL and one inorganic layer IL, but the embodiment is not limited thereto, and the encapsulation layer TFE may have a structure in which an organic layer and an inorganic layer are alternately stacked. For example, the encapsulation layer TFE may have a structure in which an inorganic layer, an organic layer, and an inorganic layer are sequentially stacked.

The color control layer CL including one or more quantum dots QD-G and/or QD-R may be disposed on the encapsulation layer TFE. The color control layer CL may include first to third color control units CL-1, CL-2, and CL-3. The first to third color control units CL-1, CL-2, and CL-3 may be spaced apart in a direction in which the first directional axis DR1 extends. A first light blocking unit BM1 may respectively be disposed between the first to third color control units CL-1, CL-2, and CL-3.

At least one of the first to third color control units CL-1, CL-2, and CL-3 may include the quantum dots QD-G and QD-R. The quantum dots QD-G and QD-R may convert the wavelength of light emitted from the light emitting element layer LED. The first color control unit CL-1 may include a red quantum dot QD-R and convert blue light into red light. The second color control unit CL-2 may include a green quantum dot QD-G and convert blue light into green light. The third color control unit CL-3 may transmit blue light. The third color control unit CL-3 may be formed of a transparent resin, or may further include a blue pigment or a blue dye.

The core of the quantum dots QD-G and QD-R may be selected from a compound of Groups II-VI, a compound of Groups a compound of Groups I, III, and VI, a compound of Groups III-V, a compound of Groups IV-VI, an element of Group IV, a compound of Group IV, and a combination thereof.

The compound of Groups II-VI may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The compound of Groups III-VI may include a binary compound such as $In_2S_3$ and $In_2Se_3$, a ternary compound such as $InGaS_3$ and $InGaSe_3$, or any combination thereof. The compound of Groups I, III, and VI may include a ternary compound selected from the group consisting of AgInS, $AgInS_2$, CuInS, $CuInS_2$, $AgGaS_2$, $CuGaS_2CuGaO_2$, $AgGaO_2$, $AgAlO_2$, or any mixture thereof, or a quaternary compound such as $AgInGaS_2$ and $CuInGaS_2$.

The compound of Groups III-V may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The compound of Groups III-V may further include a Group II metal. For example, InZnP, etc. may be selected as a compound of Groups III, II, and V.

The compound of Groups IV-VI may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, or a quaternary compound may be present in particles in a uniform concentration distribution, or may be present in the same particles in a partially different concentration distribution. In addition, a core/shell structure in which one quantum dot surrounds another quantum dot may be present. An interface between the core and the shell may have a concentration gradient in which the concentration of an element present in the shell becomes lower towards the center.

In some embodiments, the quantum dot may have the core/shell structure including a core having nano-crystals, and a shell surrounding the core, which are described above. The shell of the quantum dot may serve as a protection layer to prevent the chemical deformation of the core so as to keep semiconductor properties, and/or a charging layer to impart electrophoresis properties to the quantum dot. The shell may be a single layer or multiple layers. An interface between the core and the shell may have a concentration gradient in which the concentration of an element present in the shell becomes lower towards the center. Examples of the shell of the quantum dot may be a metal, a non-metal oxide, a semiconductor compound, or a combination thereof.

For example, the metal or the non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or a ternary compound such as $MgAl_2O_4$, $CoFe_2O_4$, $NiFe_2O_4$, and $CoMn_2O_4$, but the embodiment is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment is not limited thereto.

The quantum dots QD-G and QD-R may have a full width of half maximum (FWHM) of a light emission wavelength spectrum of about 45 nm or less, preferably about 40 nm or less, more preferably about 30 nm or less, and color purity or color reproducibility may be enhanced in the above ranges. In addition, light emitted through the quantum dots QD-G and QD-R is emitted in all directions, and thus a wide viewing angle may be improved.

In addition, although the form of the quantum dots QD-G and QD-R is not particularly limited as long as it is a form commonly used in the art, and more specifically, a quantum dot in the form of generally spherical, generally pyramidal, generally multi-armed, or generally cubic nanoparticles, or generally nanotube-shaped, generally nanowire-shaped, or generally nanofiber-shaped nanoparticles, etc. may be used.

The quantum dots QD-G and QD-R may control the color of emitted light according to particle size thereof, and thus the quantum dots QD-G and QD-R may have various light emitting colors such as blue, red, green, etc. When the emission layer EML described above includes a quantum dot material, the description of the quantum dots QD-G and QD-R may be equally applied to the quantum dot material included in the emission layer EML.

The light control layer CL may further include a scatterer. The scatterer may be an inorganic particle. For example, the scatterer may include at least one among $TiO_2$, $ZnO$, $Al_2O_3$, $SiO_2$, and a hollow silica. The scatterer may include any one among $TiO_2$, $ZnO$, $Al_2O_3$, $SiO_2$, and a hollow silica, or may be a mixture of two or more materials selected from $TiO_2$, $ZnO$, $Al_2O_3$, $SiO_2$, and a hollow silica.

The color filter layer CF may be disposed on the color control layer CL. The color filter layer CF may include first to third color filters CF-1, CF-2, and CF-3 and a second light blocking unit BM2. The first to third color filters CF-1, CF-2, and CF-3 may be disposed to be spaced apart in a direction in which the first directional axis DR1 extends. The second light blocking unit BM2 may be disposed between the color filters CF-1, CF-2, and CF-3.

The first to third color filters CF-1, CF-2, and CF-3 may be disposed corresponding to the first to third color control units CL-1, CL-2, and CL-3 included in the color control layer CL. The first color filter CF-1 is disposed corresponding to the first color control unit CL-1, and may transmit first light. The second color filter CF-2 is disposed corresponding to the second color control unit CL-2, and may transmit second light different from the first light. The third color filter CF-3 is disposed corresponding to the third color control unit CL-3, and may transmit third light different from the first light and the second light. The first color filter CF-1 may transmit light in a wavelength of about 625 nm to about 675 nm. The second color filter CF-2 may transmit light in a wavelength of about 500 nm to about 570 nm. The third color filter CF-3 may transmit light in a wavelength of about 410 nm to about 480 nm. For example, the first light may be red light, the second light may be green light, and the third light may be blue light. The first color filter CF-1 may transmit red light, and block blue light and green light. The second color filter CF-2 may transmit green light, and block red light and blue light. The third color filter CF-3 may transmit blue light, and block green light and red light.

The color filters CF-1, CF-2, and CF-3 each may include a polymer photosensitive resin, a pigment or a dye. The first color filter CF-1 may include a red pigment or a red dye, the second color filter CF-2 may include a green pigment or a green dye, and the third color filter CF-3 may include a blue pigment or a blue dye. The embodiment is not limited thereto, and the third color filter CF-3 may not include a pigment or a dye. The third color filter CF-3 may include a polymer photosensitive resin, but not include a pigment or a dye. The third color filter CF-3 may be transparent. The third color filter CF-3 may be formed of a transparent photosensitive resin.

On a plane (i.e., in a plan view), an edge of the first light blocking unit BM1 and an edge of the second light blocking unit BM2 may overlap. The edge of the first light blocking unit BM1 and the edge of the second light blocking unit BM2 may overlap in a direction in which the third directional axis DR3 extends. The first light blocking unit BM1 and the second light blocking unit BM2 may be formed including an organic light blocking material or an inorganic light blocking material containing a black pigment or a black dye. In addition, alternately, the first light blocking unit BM1 and the second light blocking unit BM2 may be formed including an organic light blocking material or an inorganic light blocking material containing a blue pigment or a blue dye. For example, the first light blocking unit BM1 may be formed of a light blocking material including a black pigment or a black dye, and the second light blocking unit BM2 may be formed of a light blocking material including a blue pigment or a blue dye. However, the embodiment is not limited thereto, and the second light blocking unit BM2 may be omitted.

A low refractive layer LR may be disposed between the color control layer CL and the color filter layer CF. The low refractive layer LR may have a refractive index of about 1.1 to about 1.3. The low refractive layer LR may totally reflect some of the blue light emitted from the color control layer CL towards the color filter layer CF to be re-incident to the color control layer CL. The blue light may be light emitted from the light emitting element layer LED. Some of the blue light may be re-incident to the first color control unit CL-1 or the second color control unit CL-2 included in the color control layer CL. As described above, the first color control unit CL-1 may turn the re-incident blue light into red light, and the second color control unit CL-2 may turn the re-incident blue light into green light. Luminous efficiency of the display device DD may be improved through such light recycling.

Insulating layers PA1, PA2, and PA3 may be disposed between the encapsulation layer TFE and the color control layer CL, above the low refractive layer LR, and below the low refractive layer LR, respectively. The first insulating layer PA1 may be disposed between the encapsulation layer TFE and the color control layer CL. The second insulating layer PA2 may be disposed below the low refractive layer LR, and the third insulating layer PA3 may be disposed above the low refractive layer LR. The first to third insulating layers PA1, PA2, and PA3 may be optically transparent. The insulating layers PA1, PA2, and PA3 each may be formed of a single layer or a plurality of layers. However, the embodiment is not limited thereto, and at least one of the first to third insulating layers PA1, PA2, and PA3 may be omitted in the display device DD.

An overcoat layer OC may be disposed between the third insulating layer PA3 and the color filter layer CF. The overcoat layer OC may be a planarization layer. For example, the overcoat layer OC may have a thickness of about 1,000 nm to about 5,000 nm. Unlike the one shown in FIG. 3, in the display device of an embodiment, the overcoat layer OC may be omitted.

In an embodiment, the anti-reflection member LPM may be disposed on the color filter layer CF. Referring to FIGS. 4 and 5, the anti-reflection members LPM and LPM-1 may include a first coating layer CA1, an inorganic film HR, and a second coating layer CA2, which are sequentially stacked. The first coating layer CA1 may be disposed on the color filter layer CF, and the second coating layer CA2 may be disposed on the first coating layer CA1. The inorganic film HR may be disposed between the first coating layer CA1 and the second coating layer CA2. Unlike FIG. 4, FIG. 5 illustrates that the inorganic film HR includes a first sub-inorganic film SR1 and a second sub-inorganic film SR2.

The anti-reflection members LPM and LPM-1 may be directly disposed on the color filter layer CF. In an embodiment, the first coating layer CA1 included in the anti-reflection members LPM and LPM-1 may be directly disposed on the color filter layer CF. The first coating layer CA1 may be a planarization layer. The first coating layer CA1 may be directly disposed on the color filter layer CF to planarize an upper surface of the color filter layer CF. The thickness T1 of the first coating layer CA1 may be greater than the thickness T2 of the second coating layer CA2 and the thickness T3 of the inorganic film HR. The thickness T1 of the first coating layer CA1 may be about 3,000 nm to about 10,000 nm. The thickness T2 of the second coating layer CA2 may be about 80 nm to about 100 nm. The thickness T3 of the inorganic film HR may be about 50 nm to about 130 nm. The thickness T2 of the second coating layer CA2 may be about 0.6 times to about 2.0 times greater than a thickness T3 of the inorganic film HR.

The refractive index of the second coating layer CA2 is smaller than the refractive index of the inorganic film HR, and the thickness T2 of the second coating layer CA2 and the thickness T3 of the inorganic film HR may be the same, or the thickness T2 of the second coating layer CA2 may be less than the thickness T3 of the inorganic film HR. Unlike the one above, the thickness T2 of the second coating layer CA2 may be greater than the thickness T3 of the inorganic film HR. Destructive interference of light may be caused between the inorganic film HR having a relatively large refractive index and the second coating layer CA2 having a relatively small refractive index. The display device DD of an embodiment includes the inorganic film HR and the second coating layer CA2, and the destructive interference may cancel external light such as lighting and natural light. Accordingly, reflection due to the external light in the display device DD may be reduced.

The second coating layer CA2 may have a refractive index of about 1.2 to about 1.5. For example, the second coating layer CA2 may have a refractive index of about 1.3 to about 1.5. The inorganic film HR may have a refractive index of about 1.6 to about 2.2. For example, the inorganic film HR may have a refractive index of about 2.1 to about 2.2. A difference in refractive index between the second coating layer CA2 and the inorganic film HR may be about 0.1 to about 1.0. For example, the difference in refractive index between the second coating layer CA2 and the inorganic film HR may be about 0.6 to about 0.9. However, the embodiment is presented as an example and is not limited thereto. When the difference in refractive index between the second coating layer CA2 and the inorganic film HR is too small, destructive interference of light may not be induced. When the difference in refractive index between the second coating layer CA2 and the inorganic film HR is less than about 0.1, destructive interference of light may not be induced, and the reflectance properties of the display device may have no improvements.

Referring to FIG. 5, the inorganic film HR may include a first sub-inorganic film SR1 disposed on the first coating layer CA1 and a second sub-inorganic film SR2 disposed on the first sub-inorganic film SR1. The second sub-inorganic film SR2 may be disposed between the first sub-inorganic film SR1 and the second coating layer CA2.

In an embodiment, the first sub-inorganic film SR1 may have a smaller refractive index than the second sub-inorganic film SR2. The first sub-inorganic film SR1 may have a greater refractive index than the second coating layer CA2. The first sub-inorganic film SR1 may have a refractive index of about 1.6 to about 1.8. The second sub-inorganic film SR2 may have a refractive index of about 1.8 to about 2.2. The thickness T4 of the first sub-inorganic film SR1 may be about 60 nm to about 120 nm. The thickness T5 of the second sub-inorganic film SR2 may be about 50 nm to about 130 nm.

In the anti-reflection member according to an embodiment, the second coating layer CA2 may a smaller refractive index than the inorganic film HR. The thickness T2 of the second coating layer CA2 may be about 0.6 times to 2.0 times greater than the thickness T3 of the inorganic film HR, and the refractive index of the second coating layer CA2 may be about 0.1 to about 1.0 times less than the inorganic film HR.

The display device DD of an embodiment may include the anti-reflection members LPM and LPM-1 disposed on the color filter layer CF, and the anti-reflection members LPM and LPM-1 may include the first coating layer CA1, the inorganic film HR, and the second coating layer CA2, which are sequentially stacked. When the difference refractive index between the second coating layer CA2 and the inorganic film HR, the thickness T2 of the second coating layer CA2, and the thickness T3 of the inorganic film HR are optimized, destructive interference of light may be induced. The second coating layer CA2 may have a smaller refractive index than the inorganic film HR. The light reflected from the second coating layer CA2 and the light reflected from the inorganic film HR may cancel each other, thereby minimizing reflection caused due to external light in the display device DD.

A phase of the light reflected from the second coating layer CA2 and a phase of the light reflected from the inorganic film HR may be opposite, and light having opposite phases may cancel each other. The destructive interference may be induced in the anti-reflection members LPM and LPM-1 including the second coating layer CA2 and the inorganic film HR. Accordingly, reflection of external light in the display device DD may be minimized.

The first coating layer CA1 may have a smaller refractive index than the inorganic film HR. The first coating layer CA1 may have a refractive index of about 1.2 to about 1.5. The refractive index of the first coating layer CA1 and the refractive index of the second coating layer CA2 may be the same. Alternatively, the refractive index of the first coating layer CA1 and the refractive index of the second coating layer CA2 may be different.

The first coating layer CA1 and the second coating layer CA2 each may have a hardness of about 0.4 GPa to about 0.9 GPa. The hardness of the first coating layer CA1 and the hardness of the second coating layer CA2 may be the same. However, the embodiment is not limited thereto, and the hardness of the first coating layer CA1 and the hardness of the second coating layer CA2 may be different. For example, the first coating layer CA1 may have a greater hardness than the second coating layer CA2. Alternatively, the second coating layer CA2 may have a greater hardness than the first coating layer CA1.

According to an embodiment, each of the first coating layer CA1 and the second coating layer CA2 may include a polymer resin. The polymer resin included in the first coating layer CA1 and the polymer resin included in the second coating layer CA2 may be the same. Alternately, a polymer resin included in the first coating layer CA1 and a polymer resin included in the second coating layer CA2 may be different.

Each of the first coating layer CA1 and the second coating layer CA2 may include a polymer resin including at least one of first to fourth repeat units. Each of the polymer resins may include a polymer resin including two or more repeat units among the first to fourth repeat units below.

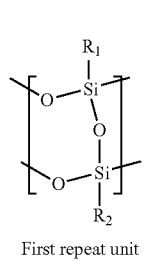

First repeat unit

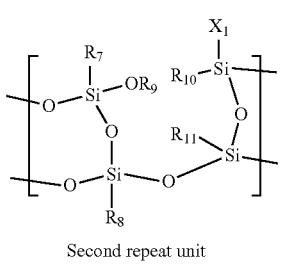

Second repeat unit

-continued

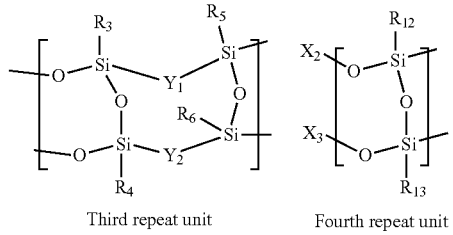

Third repeat unit

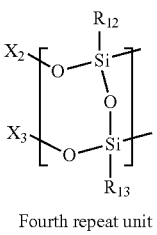

Fourth repeat unit

In the third repeat unit, at least one of $Y_1$ or $Y_2$ may be $[(SiO_{3/2}R_{21})_{4+2n}O]$, and the other is O or $NR_{22}$. Both $Y_1$ and $Y_2$ may be $[SiO_{3/2}R_{21})_{4+2n}O]$. Alternatively, at least any one of $Y_1$ or $Y_2$ may be $[(SiO_{3/2}R_{21})_{4+2n}O]$, and the other is O or $NR_{22}$. n may be an integer of 1 to 20. In the second repeat unit, $X_1$ is $[((SiO_{3/2}R_{23})_{4+2m}O]$ or $R_{24}$, and m may be an integer of 1 to 20. In the fourth repeat unit, $X_2$ and $X_3$ may be each independently $[(SiO_{3/2}R_{25})_{4+2j}O]$ or $R_{26}$, and j may be an integer of 1 to 20.

In the first to fourth repeat units, $R_{21}$ to $R_{26}$ may be each independently a substituted or unsubstituted alkyl group having 1 to 12 carbon atoms.

$R_1$ to $R_{13}$ may be each independently a hydrogen atom, a deuterium atom, a halogen atom, an isocyanate group, a cyano group, a nitro group, a substituted or unsubstituted amine group, a substituted or unsubstituted epoxy group, a substituted or unsubstituted acrylic group, a substituted or unsubstituted oxy group, a substituted or unsubstituted thiol group, a substituted or unsubstituted alkyl group having 1 to 12 carbon atoms, a substituted or unsubstituted heterocycloalkyl group having 3 to 12 ring-forming carbon atoms, a substituted or unsubstituted alkenyl group having 2 to 12 carbon atoms, a substituted or unsubstituted aryl group having 6 to 12 ring-forming carbon atoms, or a substituted or unsubstituted heteroaryl group having 2 to 12 ring-forming carbon atoms.

In an embodiment, the first coating layer CA1 and the second coating layer CA2 each may include two or more repeat units among the first to fourth repeat units. For example, the first coating layer CA1 and the second coating layer CA2 may include at least one of the first repeat unit or the third repeat unit.

The first coating layer CA1 and the second coating layer CA2 may include a poly silsesquioxane represented by Formulas 1 to 14 below. Formulas 1 to 14 may include two or more repeat units among the first to fourth repeat units. In Formulas 1 to 14, the number of the first to fourth repeat units may be singular or plural, respectively. For example, Formulas 1 to 14 may include two first repeat units and one third repeat unit. The first repeat unit may be respectively bonded to both sides of a linking group of the third repeat unit. A substituent may be bonded to a linking group of the first repeat unit positioned at an edge. Substituents bonded to repeat units are not limited to any one embodiment. This is presented as an example, and the number and type of repeat units included in the polysilsesquioxane are not limited thereto.

In an embodiment, the first coating layer CA1 and the second coating layer CA2 each may include a polymer resin represented by any one of Formulas 1 to 9 below. Formula 1 may include the first repeat unit and the third repeat unit. Formula 2 may include one first repeat unit and two third repeat units, and the third repeat unit may be respectively connected to both sides of the linking group of the first repeat unit. Formula 3 may include the first repeat unit, the third repeat unit, and the fourth repeat unit, and the third repeat unit and the fourth repeat unit may be connected to both sides of the linking group of the first repeat unit. Formula 4 may include the first repeat unit, the second repeat unit, and the third repeat unit, and the first repeat unit and the third repeat unit may be connected to both sides of the linking group of the second repeat unit.

Formulas 5 to 7 may include four repeat units. Formula 5 may include one first repeat unit, one second repeat unit, and two third repeat units, and the third repeat unit, the first repeat unit, the second repeat unit, and the third repeat unit may be sequentially connected. Formula 6 may include the first repeat unit, the second repeat unit, the third repeat unit, and the fourth repeat unit, and the fourth repeat unit, the first repeat unit, the second repeat unit, and the third repeat unit may be sequentially connected. Formula 7 may include two first repeat units, one second repeat unit, and one third repeat unit, and the first repeat unit, the second repeat unit, the first repeat unit, and the third repeat unit may be sequentially connected.

Formulas 8 and 9 each may include five repeat units. Formula 8 may include one first repeat unit, one second repeat unit, and two third repeat units, and the third repeat unit, the first repeat unit, the second repeat unit, the first repeat unit, and the third repeat unit may be sequentially connected. Formula 9 may include two first repeat units, one second repeat unit, one third repeat unit, and one fourth repeat unit, and the fourth repeat unit, the first repeat unit, the second repeat unit, the first repeat unit, and the third repeat unit may be sequentially connected.

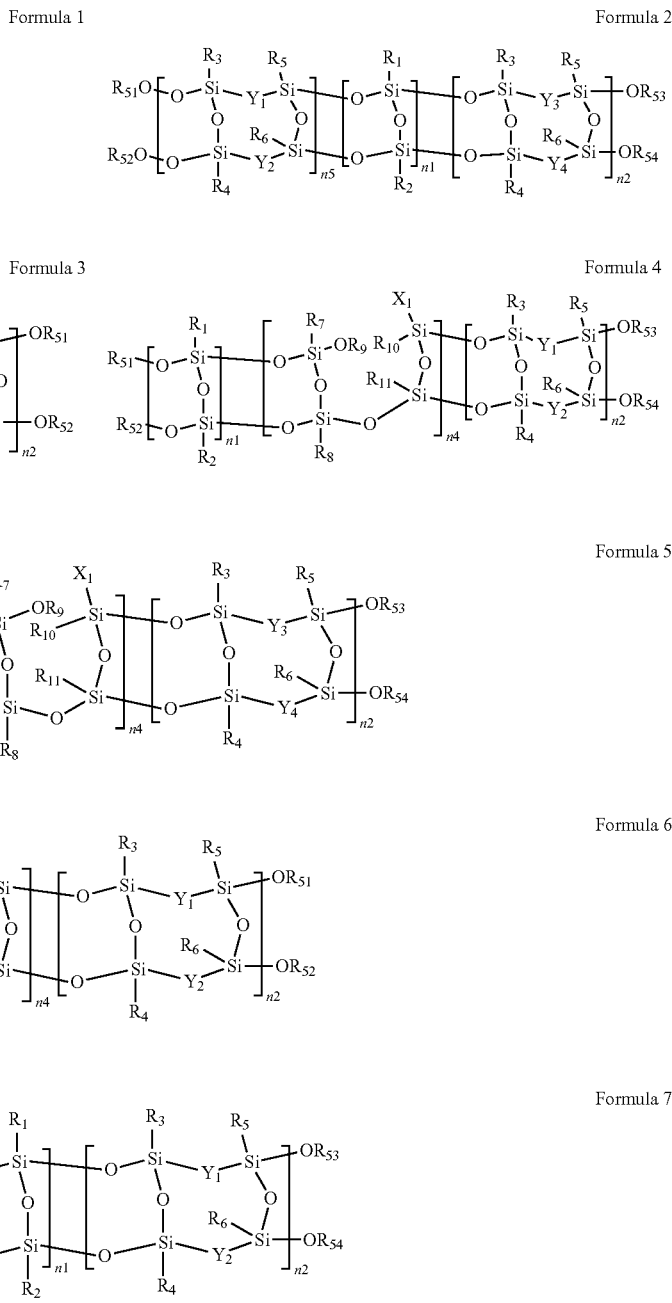

-continued

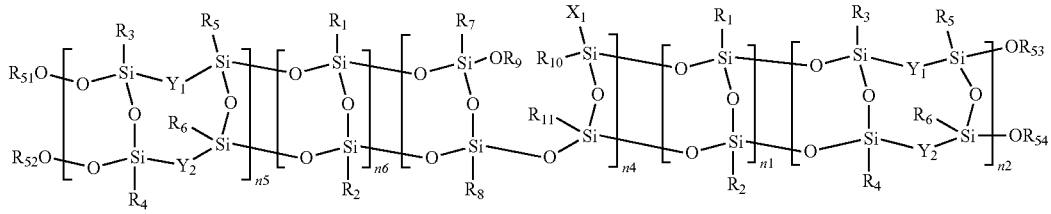

Formula 8

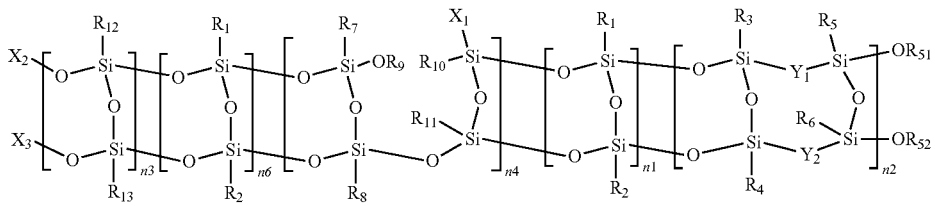

Formula 9

In Formulas 2, 5, and 8 above, at least one of $Y_3$ or $Y_4$ may be $[(SiO_{3/2}R_{23})_{4+2n}O]$, and the other is O or $NR_{24}$. For example, $Y_3$ and $Y_4$ may be $[(SiO_{3/2}R_{23})_{4+2n}O]$. In addition, $Y_3$ may be $[(SiO_{3/2}R_{23})_{4+2n}O]$, and $Y_4$ may be O or $NR_{24}$. $Y_4$ may be $[(SiO_{3/2}R_{23})_{4+2n}O]$, and $Y_4$ may be O or $NR_{24}$.

In Formulas 3 to 9, at least one of $X_1$ to $X_3$ may be $[SiO_{3/2}R_{25})_{4+2m}O]$, and the other is $R_{26}$. For example, $X_1$ to $X_3$ may be $[(SiO_{3/2}R_{25})_{4+2m}O]$. In addition, $X_1$ may be $[(SiO_{3/2}R_{25})_{4+2m}O]$, and $X_2$ and $X_3$ may be $R_{26}$. $X_2$ and $X_3$ may be the same or different. In addition, $X_2$ may be $[(SiO_{3/2}R_{25})_{4+2m}O]$, and $X_1$ and $X_3$ may be $R_{26}$. $X_1$ and $X_3$ may be the same or different. $X_3$ may be $[(SiO_{3/2}R_{25})_{4+2m}O]$, and $X_1$ and $X_2$ may be $R_{26}$. $X_1$ and $X_2$ may be the same or different. m may be an integer of 1 to 20.

In Formulas 1 to 9, at least one of $Y_1$ or $Y_2$ may be $[(SiO_{3/2}R_{21})_{4+2n}O]$, and the other is O or $NR_{22}$. n may be an integer of 1 to 20. $R_{21}$ to $R_{26}$ and $R_{51}$ to $R_{54}$ may be each independently a substituted or unsubstituted alkyl group having 1 to 12 carbon atoms. The variables n1, n2, n5, and n6 may be each independently an integer of 1 to 100,000. n3 may be 1 or 2, and n4 may be an integer of 1 to 500.

$R_1$ to $R_{13}$ may be each independently a hydrogen atom, a deuterium atom, a halogen atom, an isocyanate group, a cyano group, a nitro group, a substituted or unsubstituted amine group, a substituted or unsubstituted epoxy group, a substituted or unsubstituted acrylic group, a substituted or unsubstituted oxy group, a substituted or unsubstituted thiol group, a substituted or unsubstituted alkyl group having 1 to 12 carbon atoms, a substituted or unsubstituted heterocycloalkyl group having 3 to 12 ring-forming carbon atoms, a substituted or unsubstituted alkenyl group having 2 to 12 carbon atoms, a substituted or unsubstituted aryl group having 6 to 12 ring-forming carbon atoms, or a substituted or unsubstituted heteroaryl group having 2 to 12 ring-forming carbon atoms.

In addition, the first coating layer CA1 and the second coating layer CA2 each may include a polymer resin represented by any one of Formulas 10 to 14 below.

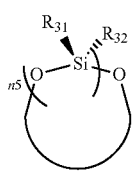

Formula 10

-continued

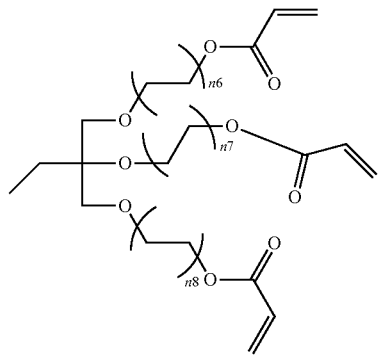

Formula 11

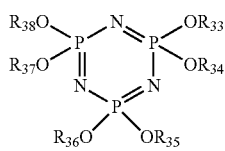

Formula 12

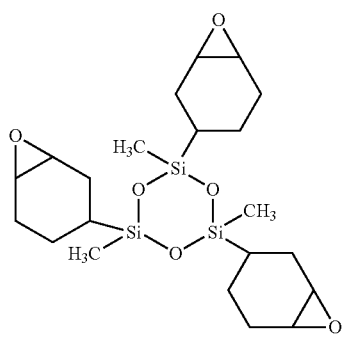

Formula 13

-continued

Formula 14

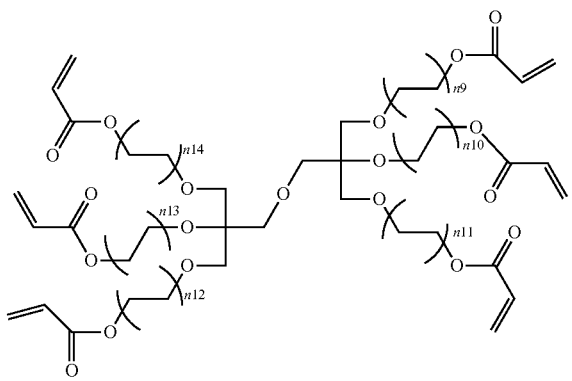

In Formulas 10 to 14, n5 may be an integer of 1 to 20, n6 to n8 may be each independently an integer of 1 to 5, n9 to n14 may be each independently an integer of 1 to 12. $R_{31}$ to $R_{38}$ may be represented by $R_a$ or $R_b$ below.

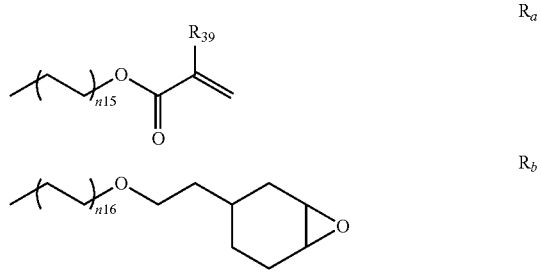

In $R_a$ and $R_b$, n15 and n16 may be each independently an integer of 1 to 12, and $R_{39}$ may be a hydrogen atom or a methyl group.

The first coating layer CA1 and the second coating layer CA2 including the polymer resin represented by any one of Formulas 1 to 14 may exhibit high hardness characteristics. The first coating layer CA1 and the second coating layer CA2 containing a polysilsesquioxane represented by Formulas 1 to 14 may exhibit improved hardness. The first coating layer CA1 and the second coating layer CA2 each may have a hardness of about 0.4 GPa to about 0.9 GPa. Accordingly, a display device including the first coating layer CA1 and the second coating layer CA2 according to an embodiment may be prevented from being damaged due to external friction.

The inorganic film HR according to an embodiment may include at least one among a silicon nitride, a silicon oxynitride, and a titanium dioxide ($TiO_2$). The first sub-inorganic film SR1 and the second sub-inorganic film SR2 each may include at least one among a silicon nitride, a silicon oxynitride, and a titanium dioxide. The first sub-inorganic film SR1 and the second sub-inorganic film SR2 may include different materials. Alternatively, the first sub-inorganic film SR1 and the second sub-inorganic film SR2 may include the same materials. The inorganic film HR included in the anti-reflection member LPM may be formed through chemical vapor deposition (CVD). When the first sub-inorganic film SR1 and the second sub-inorganic film SR2 include the same materials, deposition rates for each layer may be different. For example, the first sub-inorganic film SR1 may have a higher deposition rate than the second sub-inorganic film SR2. The refractive index of the first sub-inorganic film SR1 deposited at a relatively high rate may be smaller than the refractive index of the second sub-inorganic film SR2 deposited at a relatively low rate. However, this is presented as an example, and a method for forming the inorganic film HR is not limited thereto.

Referring to FIG. 3, discussed in further detail below, a functional layer AF may be disposed on the anti-reflection member LPM. The functional layer AF may include a fluorine-containing compound. The functional layer AF may be an anti-finger layer. In the display device DD according to an embodiment, the functional layer AF may be omitted. The functional layer AF may be omitted, and the second coating layer CA2 of the anti-reflection member LPM may be exposed to the outside. As described above, the second coating layer CA2 having high hardness may exhibit good durability against external friction.

In the anti-reflection members LPM and LPM-1 according to an embodiment, the first coating layer CA1 and the second coating layer CA2 may be formed through wet coating. The coating layers CA1 and CA2 formed through the wet coating may be formed by directly applying a solution to components positioned below. For example, the first coating layer CA1 may be formed by applying a solution onto the color filter layer CF. As the first coating layer CA1 and the second coating layer CA2 are formed through the wet coating, the minimum distance DO between the display panels DP1 and DP2 in the display device DD-a including the plurality of display panels DP1 and DP2 may be reduced. The minimum distance DO between the display panels DP1 and DP2 disposed to be adjacent on a plane may be about 30 μm or less.

In a display device including a film-type anti-reflection member, the minimum distance between adjacent display panels on a plane may be about 500 μm or greater. When an anti-reflection member made of a separate film is provided, the minimum distance between adjacent display panels on a plane may be about 500 μm or greater. Due to the film-type anti-reflection member, the minimum distance between display panels may be about 500 μm or greater. The display device DD-a according to an embodiment may include the anti-reflection members LPM and LPM-1 formed through the wet coating, and may thus exhibit improvements in the minimum distance DO between the display panels DP1 and DP2.

Figure 6:
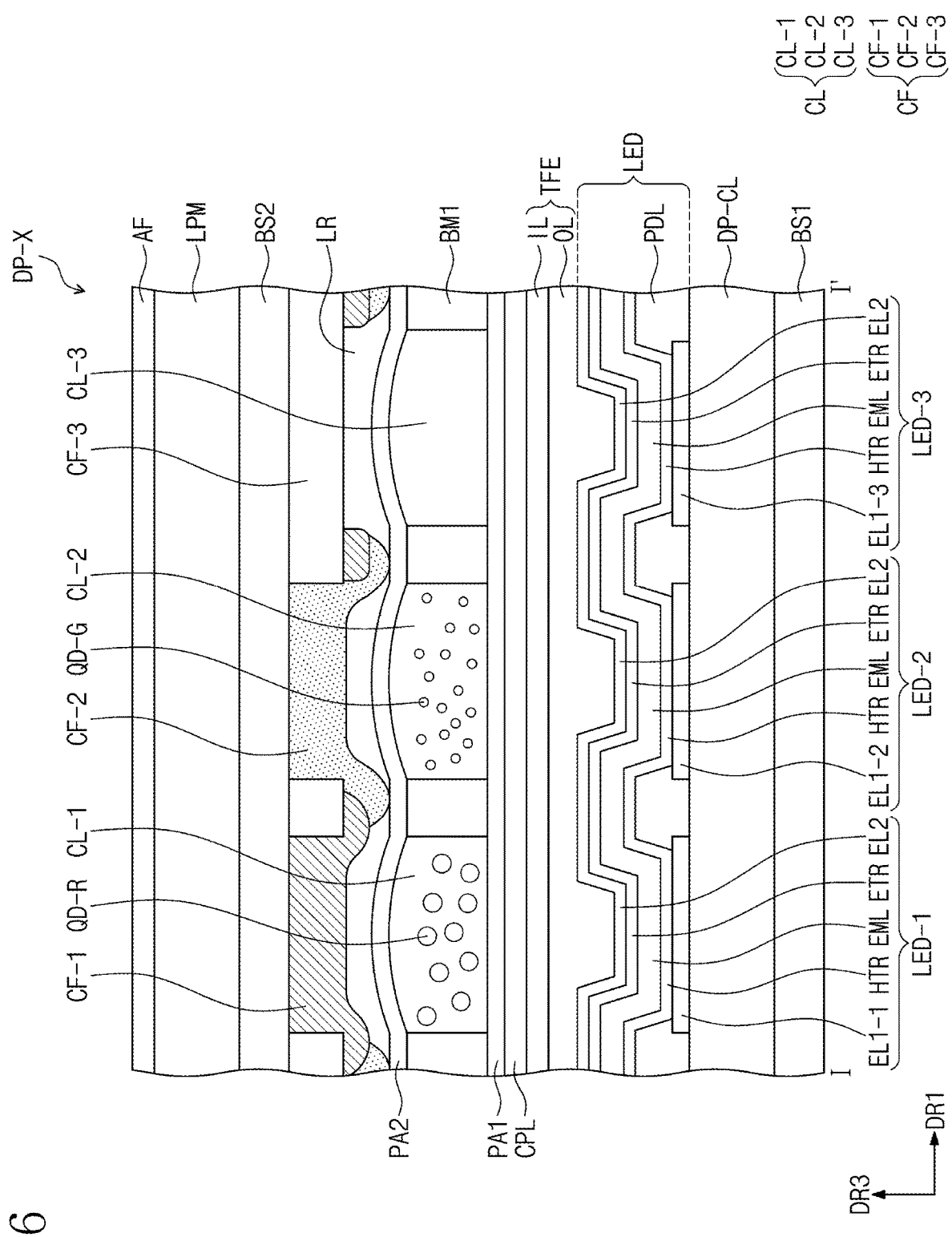
FIG. 6 is a cross-sectional view illustrating another embodiment of the portion of the display device taken along line I-I' of FIG. 1.

FIG. 6 illustrates a display panel DP-X according to an embodiment, and unlike FIG. 3, FIG. 6 illustrates that the display panel DP-X further includes a support substrate BS2. The support substrate BS2 may be disposed between the color filter layer CF and the anti-reflection member LPM. Hereinafter, in the description of FIG. 6, content overlapping the one described with reference to FIGS. 3 to 5 will not be described again, and differences will be mainly be described to avoid redundancy.

The display panel DP-X according to an embodiment may include a light emitting element layer LED, a color control layer CL, a color filter layer CF, and an anti-reflection member LPM, which are sequentially stacked. In addition, the display panel DP-X may further include a support substrate BS2 disposed between the color filter layer CF and the anti-reflection member LPM.

The support substrate BS2 may be a polymer substrate, a plastic substrate, a glass substrate, a quartz substrate, etc. The support substrate BS2 may be a transparent insulating substrate. The support substrate BS2 may be rigid or flexible.

A capping layer CPL may be disposed between the encapsulation layer TFE and the first insulating layer PA1. The capping layer CPL may be optically transparent. The capping layer CPL may be a combination of a configuration from the base layer B $S_1$ to the encapsulation layer TFE and a configuration from the first insulating layer PA1 to the support substrate BS2. Unlike the one illustrated, the capping layer CPL may be omitted in the display device according to an embodiment.

FIG. 6 illustrates that one side of each of the first color filter CF-1, the second color filter CF-2, and the third color filter CF-3 partially overlaps. In an area overlapping the first light blocking unit BM1, one side of each of the first color filter CF-1, the second color filter CF-2, and the third color filter CF-3 may partially overlaps. However, the embodiments are not limited thereto, and in an area overlapping the first light blocking unit BM1, edges of each of the first color filter CF-1, the second color filter CF-2, and the third color filter CF-3 may be spaced apart in one direction.

Definition of Terms

As used herein, the term "atom" may mean an element or its corresponding radical bonded to one or more other atoms.

As used herein, the terms "hydrogen," "deuterium," and "halogen" refer to their respective atoms and corresponding radicals. Examples of a halogen atom may include a fluorine atom, a chlorine atom, a bromine atom, and an iodine atom and the abbreviations "—F, —Cl, —Br, and —I" are radicals of, respectively, fluorine, chlorine, bromine, and iodine.

As used herein, the abbreviations "n-", "s-", "t-", and "i-" refer to, respectively, "normal," "secondary," tertiary," and the prefix "-iso" as the defined as the same, as used in, e.g., isobutane.

As used herein, a substituent for a monovalent group, e.g., alkyl, may also be, independently, a substituent for a corresponding divalent group, e.g., alkylene.

As used herein, the term "substituted or unsubstituted" may indicate substitution or unsubstitution with at least one substituent selected from the group consisting of a deuterium atom, a halogen atom, a cyano group, a nitro group, an amine group, a silyl group, an oxy group, a thiol group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents presented above as an example may be substituted or unsubstituted. For example, a biphenyl group may be interpreted as an aryl group or as a phenyl group substituted with a phenyl group.

As used herein, an alkyl group may be a linear, a branched or a cyclic type. The number of carbon atoms in the alkyl group is 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

As used herein, a heterocycloalkyl group may include at least one of B, O, N, P, Si, or S as a hetero atom. When the heterocycloalkyl group contains two or more hetero atoms, the two or more hetero atoms may be the same as or different from each other. The number of carbon atoms in the heterocycloalkyl group is 1 to 20, 1 to 10, or 1 to 6.

As used herein, an aryl group refers to any functional groups or substituents derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but are not limited thereto.

As used herein, a heteroaryl group may include at least one of B, O, N, P, Si, or S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

As used herein, a thiol group may include an alkyl thio group and an aryl thio group. The thiol group may refer to the one that a sulfur atom is bonded to an alkyl group or an aryl group defined above. Examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but are not limited to thereto.

As used herein, an oxy group may refer to the one that an oxygen atom is bonded to an alkyl group or an aryl group defined above. The oxy group may include an alkoxy group and an aryl oxy group. The alkoxy group may be linear, branched or cyclic. The number of carbon atoms in the alkoxy group is not particularly limited, but may be, for example, 1 to 20, or 1 to 10. Examples of the oxy group include methoxy, ethoxy, n-propoxy, isopropoxy, butoxy, pentyloxy, hexyloxy, octyloxy, nonyloxy, decyloxy, benzyloxy, etc., but are not limited thereto.

As used herein, an alkenyl group may be linear or branched. Although the number of carbon atoms is not specifically limited, but may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but are not limited thereto.

As used herein, the number of carbon atoms in an amine group is not particularly limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methyl-anthracenylamine group, a triphenylamine group, etc., but are not limited thereto.

EXAMPLES

Figure 7:
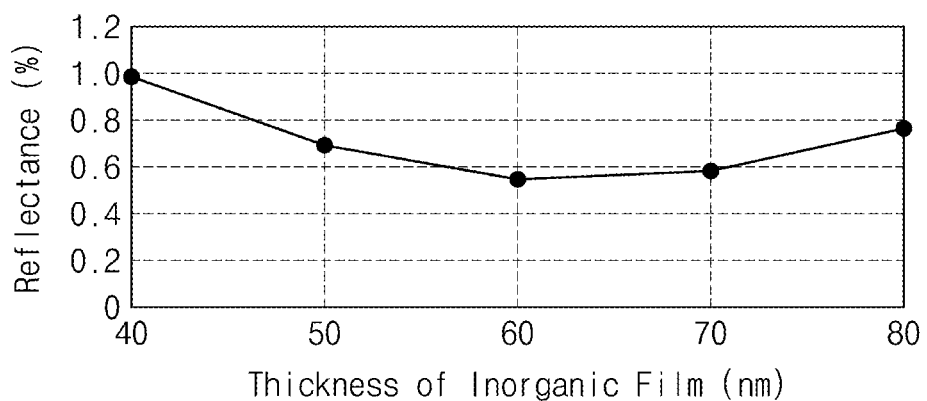
FIG. 7 is a graphical depiction illustrating reflectance percent versus thickness of inorganic films of embodiments.
Figure 8:
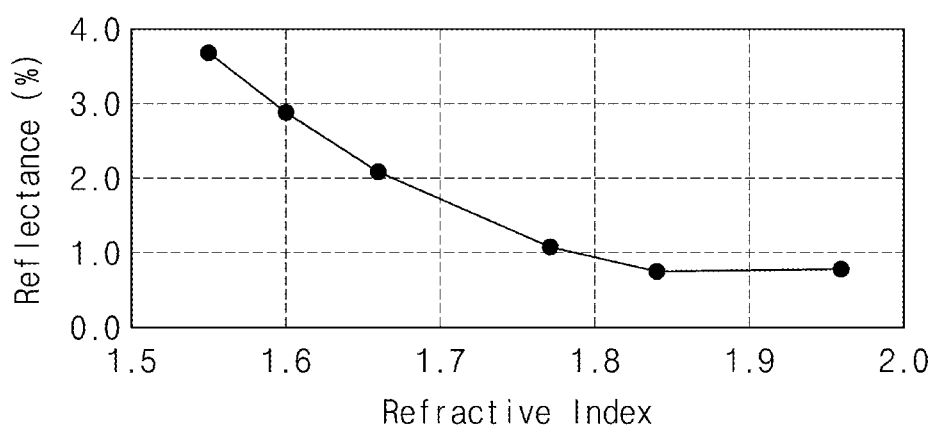
FIG. 8 is a graphical depiction illustrating reflectance percent versus refractive index of inorganic films of embodiments.
Figure 9:
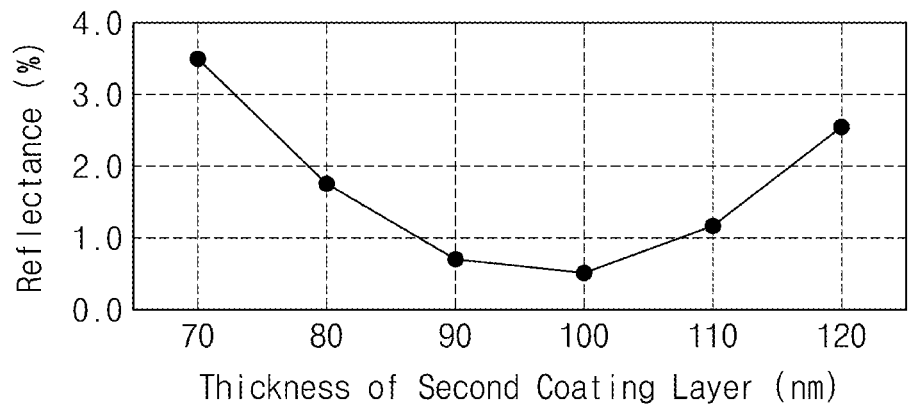
FIG. 9 is a graphical depiction illustrating reflectance percent versus thickness of second coating layers of embodiments.
Figure 10:
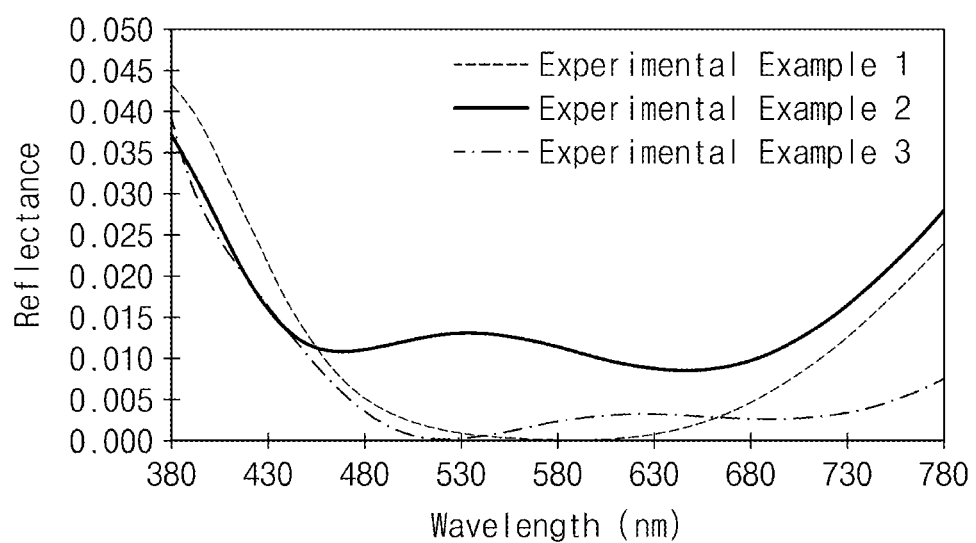
FIG. 10 is a graphical depiction illustrating reflectance versus wavelength of embodiments of stacked sub-inorganic films and a coating layer.

FIG. 7 is a graphical depiction illustrating reflectance percent versus thickness of inorganic films of embodiments. FIG. 8 is a graphical depiction illustrating reflectance percent versus refractive index of inorganic films of embodiments. FIG. 9 is a graphical depiction illustrating reflectance percent versus thickness of second coating layers of embodiments. FIG. 10 is a graphical depiction illustrating reflectance versus wavelength of embodiments of stacked sub-inorganic films and a coating layer. The reflectance of FIGS. 7-10 is measured by a method below. The low-reflection treatment is performed on one side of the bare glass sample, black tape is attached to the other side of the bare glass sample, and reflectance is measured using a device sold under the trade designation CM3700D by Konica Minolta, Inc. of Tokyo, Japan.

FIG. 7 is a graph showing reflectance percent according to thickness of an inorganic film. In the anti-reflection member LPM including the first coating layer CA1, the inorganic film HR, and the second coating layer CA2, reflectance percent according to a change in thickness T3 of the inorganic film HR is measured and shown. When measuring the reflectance percent, an anti-reflection member including the first coating layer CA1 having a refractive index of 1.5, the inorganic film HR having a refractive index of 1.84, the second coating layer CA2 having a refractive index of 1.5, the first coating layer CA1 having a thickness T1 of 5,000 nm, and the second coating layer CA2 having a thickness T2 of 100 nm was used.

Referring to FIG. 7, it is seen that the inorganic film having a thickness of about 60 nm to about 80 nm exhibited an improved reflectance of about 0.8% or less. In addition, it is be seen that when the thickness of the inorganic film HR was about 60 nm, reflectance was about 0.6% or less. As described above, in an embodiment, the thickness T3 of the inorganic film HR may be about 50 nm to about 130 nm. The anti-reflection member LPM including the inorganic film HR having a thickness of about 50 nm to about 130 nm may exhibit low reflectance percent and may contribute to improving reflectance properties of a display device. Accordingly, it is believed that the display devices DD and DD-a including the inorganic film HR according to an embodiment may exhibit improved reflectance properties.

FIG. 8 is a graph showing reflectance percent according to refractive index of an inorganic film. In the anti-reflection member LPM including the first coating layer CA1, the inorganic film HR, and the second coating layer CA2, reflectance percent according to a change in refractive index of the inorganic film HR is measured and shown. When measuring the reflectance percent, an anti-reflection member LPM including the first coating layer CA1 and the second coating layer CA2 each having a refractive index of 1.5, the first coating layer CA1 having a thickness T1 of 5,000 nm, the second coating layer CA2 having a thickness T2 of 100 nm, and the inorganic film HR having a thickness T3 of 50 nm was used.

Referring to FIG. 8, it is seen that the reflectance percent decreased with an increase in the refractive index of the inorganic film HR. It is seen that when the refractive index of the inorganic film HR was about 1.8 to about 2.0, reflectance was about 1.0% or less. As described above, in an embodiment, the refractive index of the inorganic film HR may be about 1.6 to about 2.2. An anti-reflection member including an inorganic film having a refractive index of about 1.6 to about 2.2 may contribute to improving reflectance properties of a display device. Accordingly, it is believed that the display devices DD and DD-a according to an embodiment include the inorganic film HR having a higher refractive index than the second coating layer CA2, and may thus exhibit improved reflectance properties.

FIG. 9 is a graph showing reflectance percent according to thickness. In the anti-reflection member LPM including the first coating layer CA1, the inorganic film HR, and the second coating layer CA2, the reflectance percent according to a change in thickness of the second coating layer CA2 was measured and shown. When measuring the reflectance percent, an anti-reflection member LPM including the first coating layer CA1 and the second coating layer CA2 each having a refractive index of 1.5, the inorganic film HR having a refractive index of 1.96, the first coating layer CA1 having a thickness T1 of 5,000 nm, the inorganic film HR having a thickness T3 of 50 nm was used.

Referring to FIG. 9, it is seen that when the thickness T2 of the second coating layer CA2 was about 80 nm to about 100 nm, the reflectance percent decreased with a decrease in thickness. In addition, it is seen that when the thickness T2 of the second coating layer CA2 was about 90 nm to about 100 nm, reflectance was 1% or less. As described above, in an embodiment, the thickness of the second coating layer CA2 may be about 80 nm to about 100 nm, and the second coating layer CA2 may exhibit low reflectance percent. The anti-reflection members LPM and LPM-1 including the second coating layer CA2 having a thickness of about 80 nm to about 100 nm may contribute to improving reflectance properties of a display device. Accordingly, it is believed that the display devices DD and DD-a including the second coating layer CA2 according to an embodiment may exhibit improved reflectance properties.

FIG. 10 is a graph showing reflectance according to wavelength, and more specifically, reflectance according to wavelength in visible light ranges was measured and shown. In each of Experimental Examples 1 to 3, reflectance according to wavelength in the anti-reflection member including the first sub-inorganic film SR1, the second sub-inorganic film SR2, and the second coating layer CA2, which are sequentially stacked was measured. Reflectance was measured in a wavelength of about 380 nm to about 780 nm corresponding to the visible light ranges.

Table 1 below shows the thickness and refractive index of each of the first sub-inorganic film SR1, the second sub-inorganic film SR2, and the second coating layer CA2 in Experimental Examples 1 to 3. Reflectance is given as a value obtained by integrating reflectance values and multiplying luminous factors in a graph of FIG. 10. The first coating layer CA1 was omitted in Experimental Examples 1 to 3.

In the anti-reflection members of Experimental Examples 1 to 3, the first sub-inorganic film having a refractive index of 1.70 and a thickness of 65 nm was used. In the anti-reflection members of Experimental Examples 1 to 3, the second sub-inorganic film having a refractive index of 2.17 was used. In the anti-reflection members of Experimental Examples 1 and 2, the second sub-inorganic film having a thickness of 100 nm was used, and in the anti-reflection member of Experimental Example 3, the second sub-inorganic film having a thickness of 130 nm was used. In the anti-reflection members of Experimental Examples 1 and 3, the second coating layer having a refractive index of 1.36 and a thickness of 100 nm was used. In the anti-reflection member of Experimental Example 2, the second coating layer having a refractive index of 1.50 and a thickness of 80 nm was used.

TABLE 1

| Item | Experimental Example 1 | | Experimental Example 2 | | Experimental Example 3 | |
| --- | --- | --- | --- | --- | --- | --- |
| | Refractive index | Thickness (nm) | Refractive index | Thickness (nm) | Refractive index | Thickness (nm) |
| First sub-inorganic film | 1.70 | 65 | 1.70 | 65 | 1.70 | 65 |
| Second sub-inorganic film | 2.17 | 100 | 2.17 | 100 | 2.17 | 130 |
| Second coating layer | 1.36 | 100 | 1.50 | 80 | 1.36 | 100 |
| Reflectance (SCI) | 0.10% | | 1.17% | | 0.17% | |

A single sample is tested for each example in Table 1. The refractive index and thickness of Table 1 corresponds to the refractive index and thickness of each layer in Experimental Examples 1 to 3 of FIG. 10. The reflectance (SCI) of Table 1 is given as a value obtained by integrating reflectance values and multiplying luminous factors in a graph of FIG. 10. The refractive index and thickness of each layer correspond to an independent variable, and the reflectance (SCI) corresponds to a dependent variable. That is, in Table 1, the refractive index and thickness of each layer are set values, and the reflectance corresponds to the evaluation result. SCI means "Specular Component Included" and utilized to measure reflectance in Table 1.

Referring to FIG. 10, it is seen that the anti-reflection members of Experimental Examples 1 to 3 exhibited a low reflectance of 0.045 or less in a wavelength of about 380 nm to about 780 nm. In addition, it is seen that the anti-reflection members of Experimental Examples 1 to 3 exhibited a low reflectance of 0.020 or less in a wavelength of about 430 nm to about 730 nm. Referring to the reflectance in Table 1, it is seen that the anti-reflection members of Experimental Examples 1 to 3 exhibited a low reflectance of 1.5% or less.

In the anti-reflection members of Experimental Examples 1 to 3, it is believed that the reflectance was reduced due to destructive interference of light between the second coating layer having a relatively low refractive index and the second sub-inorganic film having a relatively high refractive index. As described above, the anti-reflection member according to an embodiment may include a first sub-inorganic film, a second sub-inorganic film, and a second coating layer, which are sequentially stacked. Accordingly, a display device including the anti-reflection member according to an embodiment may exhibit improved reflectance properties.

The display device according to an embodiment may include an anti-reflection member disposed on a color filter layer. The anti-reflection member includes a first coating layer, an inorganic film, and a second coating layer, which are sequentially stacked, and the second coating layer may have a thickness of about 0.6 times to about 2.0 times greater than the inorganic film. The second coating layer may have a smaller refractive index than the inorganic film. Accordingly, destructive interference of light may be induced in two layers having different refractive indices by optimizing the difference in refractive index and thickness of each layer. Accordingly, the display device including the two layers having different refractive indices may exhibit improved reflectance properties.

In addition, the display device according to an embodiment includes at least one display panel, and two or more display panels may be provided. The display panels each may include an anti-reflection member disposed on a color filter layer. The anti-reflection member may include a first coating layer and a second coating layer formed through wet coating, thereby minimizing the distance between the display panels. Accordingly, the display device including the plurality of display panels may exhibit improved display quality.

In an embodiment, the anti-reflection member included in the display device includes a first coating layer and a second coating layer, and the first coating layer and the second coating layer may include at least one of the first to fourth repeat units described above. The first coating layer and the second coating layer may include a polymer resin formed of the first to fourth repeat units. The polymer resin formed of the first to fourth repeat units may be a polysilsesquioxane. When the first coating layer and the second coating layer contain the polysilsesquioxane, each of the first coating layer and the second coating layer may exhibit improved hardness. Accordingly, damage due to external friction may be minimized in the display device including the first coating layer and the second coating layer.

Some of the advantages that may be achieved by implementations of the invention and/or methods of the invention include a display device according to an embodiment having an anti-reflection member disposed on a color filter layer, and may thus exhibit satisfactory reflectance.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a light emitting element layer;
a color control layer disposed on the light emitting element layer and including at least one quantum dot;
a color filter layer disposed on the color control layer; and an anti-reflection member disposed on the color filter layer, the anti-reflection member comprising:
a first coating layer disposed on the color filter layer;
a second coating layer disposed on the first coating layer; and
an inorganic film disposed between the first coating layer and the second coating layer, wherein the second coating layer has a thickness of about 0.6 times to about 2.0 times greater than the inorganic film, and the first coating layer having a greater thickness than the second coating layer and the inorganic film.

2. The display device of claim 1, further comprising a substrate disposed between the color filter layer and the anti-reflection member.

3. The display device of claim 1, wherein the inorganic film has a greater refractive index than the second coating layer.

4. The display device of claim 1, wherein the first coating layer and the second coating layer each, independently from one another, have a refractive index of about 1.2 to about 1.5.

5. The display device of claim 1, wherein the inorganic film has a refractive index of about 1.6 to about-2.2.

6. The display device of claim 1, wherein a difference in refractive index between the second coating layer and the inorganic film is about 0.1 to about 1.0.

7. The display device of claim 1, wherein the inorganic film comprises a first sub-inorganic film disposed on the first coating layer and a second sub-inorganic film disposed between the first sub-inorganic film and the second coating layer,
the first sub-inorganic film having a smaller refractive index than the second sub-inorganic film.

8. The display device of claim 7, wherein:
a refractive index of the first sub-inorganic film is equal to or greater than about 1.6 and equal to or smaller than about 1.8; and
the refractive index of the second sub-inorganic film has is greater than about 1.8 and equal to or smaller than about 2.2.

9. The display device of claim 7, wherein:
the first sub-inorganic film has a thickness of about 60 nm to about 120 nm, and
the second sub-inorganic film has a thickness of about 50 nm to about 130 nm.

10. The display device of claim 1, wherein the first coating layer has a thickness of about 3,000 nm to about 10,000 nm.

11. The display device of claim 1, wherein the second coating layer has a thickness of about 80 nm to about 100 nm.

12. The display device of claim 1, wherein the inorganic film has a thickness of about 50 nm to about 130 nm.

13. The display device of claim 1, wherein the first coating layer and the second coating layer each, independently from one another, have a hardness of about 0.4 GPa to about 0.9 GPa.

14. The display device of claim 1, wherein the inorganic film comprises at least one of a silicon nitride, a silicon oxynitride, or a titanium dioxide.

15. The display device of claim 1, wherein the first coating layer and the second coating layer each, independently from one another, comprise at least one repeat unit among first to fourth repeat units:

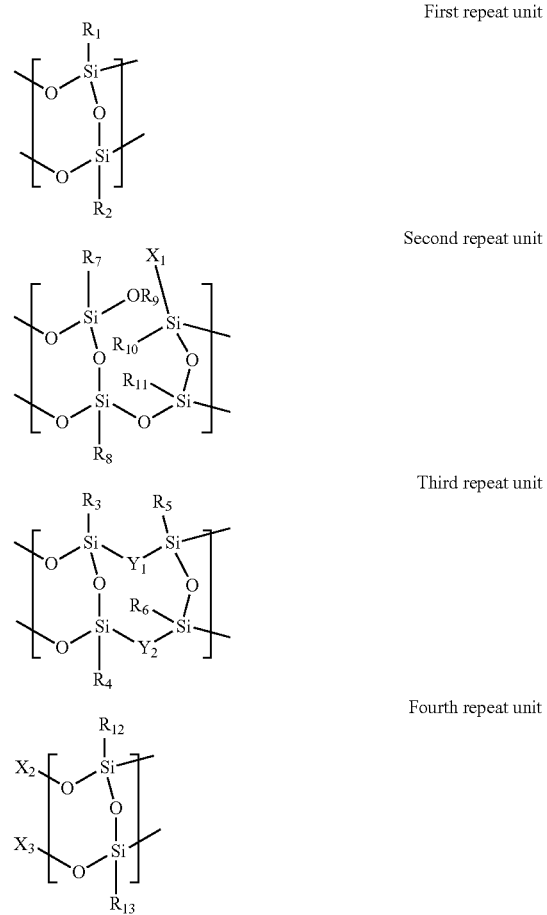

wherein, in the third repeat unit,
at least one of $Y_1$ or $Y_2$ is $[SiO_{3/2}R_{21})_{4+2n}O]$ and the other is O or $NR_{22}$,
in the second repeat unit,
$X_1$ is $[((SiO_{3/2}R_{23})_{4+2m}O]$ or $R_{24}$,
in the fourth repeat unit,
$X_2$ and $X_3$ are each, independently from one another, $[(SiO_{3/2}R_{25})_{4+2j}O]$ or $R_{26}$,
and in the first to fourth repeat units,
$R_{21}$ to $R_{26}$ are each, independently from one another, a substituted or unsubstituted alkyl group having 1 to 12 carbon atoms,
j, n and m are each, independently from one another, an integer of 1 to 20, and
$R_1$ to $R_{13}$ are each independently a hydrogen atom, a deuterium atom, a halogen atom, an isocyanate group, a cyano group, a nitro group, a substituted or unsubstituted amine group, a substituted or unsubstituted epoxy group, a substituted or unsubstituted acrylic group, a substituted or unsubstituted oxy group, a substituted or unsubstituted thiol group, a substituted or unsubstituted alkyl group having 1 to 12 carbon atoms, a substituted or unsubstituted heterocycloalkyl group having 3 to 12 ring-forming carbon atoms, a substituted or unsubstituted alkenyl group having 2 to 12 carbon atoms, a substituted or unsubstituted aryl group having 6 to 12 ring-forming carbon atoms, or a substituted or unsubstituted heteroaryl group having 2 to 12 ring-forming carbon atoms.

16. The display device of claim 15, wherein the first coating layer and the second coating layer each, independently from one another, comprise at least one of the first repeat unit or the third repeat unit.

17. The display device of claim 1, wherein the first coating layer and the second coating layer each, independently from one another, comprise a polymer resin of one of Formulas 1 to 9:

Formula 1
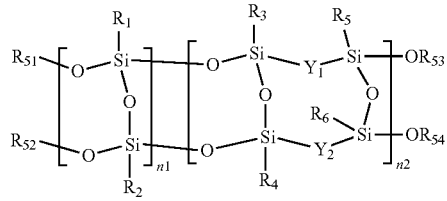

Formula 2
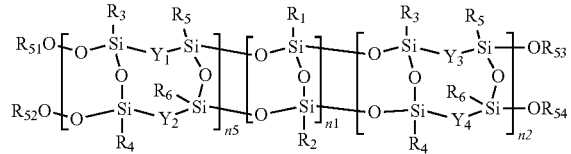

Formula 3
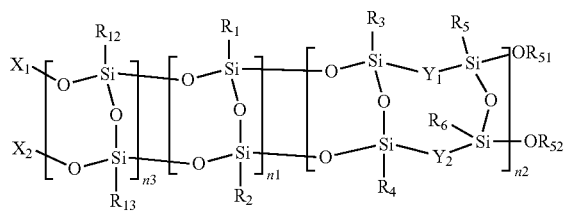

Formula 4
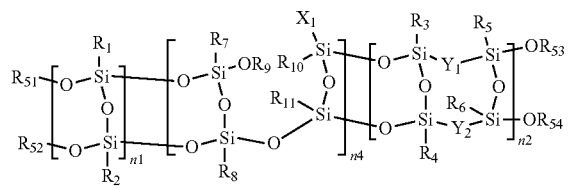

Formula 5
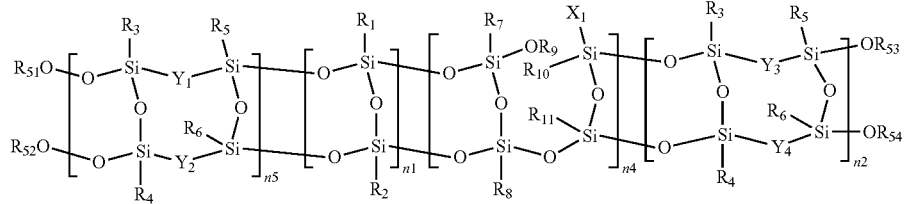

Formula 6
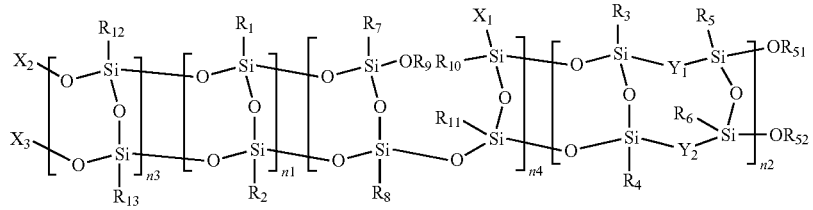

Formula 7
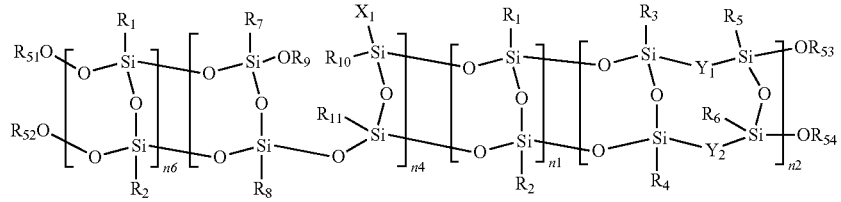

Formula 8
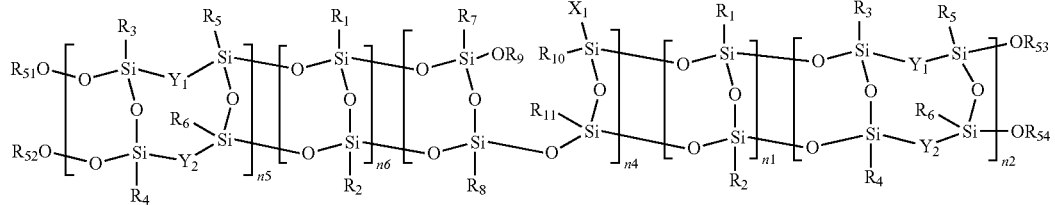

-continued

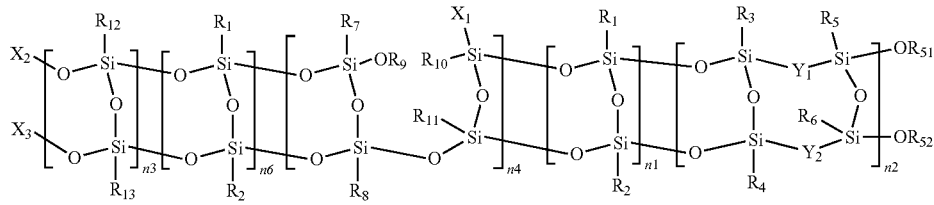

Formula 9 wherein, in Formulas 2, 5, and 8,
at least one of $Y_3$ or $Y_4$ is $[SiO_{3/2}R_{23})_{4+2n}O]$, and the other is O or $NR_{24}$,
in Formulas 3 to 9,
at least one of $X_1$ to $X_3$ is $[SiO_{3/2}R_{25})_{4+2m}O]$, and the other is $R_{26}$,
m is an integer of 1 to 20,
and in Formulas 1 to 9,
at least one of $Y_1$ or $Y_2$ is $[(SiO_{3/2}R_{21})_{4+2n}O]$, and the other is O or $NR_{22}$,
n is an integer of 1 to 20,
$R_{21}$ to $R_{26}$ and $R_{51}$ to $R_{54}$ are each, independently from one another, a substituted or unsubstituted alkyl group having 1 to 12 carbon atoms,
n1, n2, n5, and n6 are each, independently from one another, an integer of 1 to 100,000,
n3 is 1 or 2,
n4 is an integer of 1 to 500, and
$R_1$ to $R_{13}$ are each, independently from one another, a hydrogen atom, a deuterium atom, a halogen atom, an isocyanate group, a cyano group, a nitro group, a substituted or unsubstituted amine group, a substituted or unsubstituted epoxy group, a substituted or unsubstituted acrylic group, a substituted or unsubstituted oxy group, a substituted or unsubstituted thiol group, a substituted or unsubstituted alkyl group having 1 to 12 carbon atoms, a substituted or unsubstituted heterocycloalkyl group having 3 to 12 ring-forming carbon atoms, a substituted or unsubstituted alkenyl group having 2 to 12 carbon atoms, a substituted or unsubstituted aryl group having 6 to 12 ring-forming carbon atoms, or a substituted or unsubstituted heteroaryl group having 2 to 12 ring-forming carbon atoms.

18. The display device of claim 1, wherein the first coating layer and the second coating layer each, independently from one another, comprise a polymer resin of one of Formulas 10 to 14:

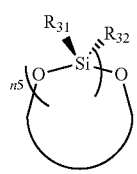

Formula 10

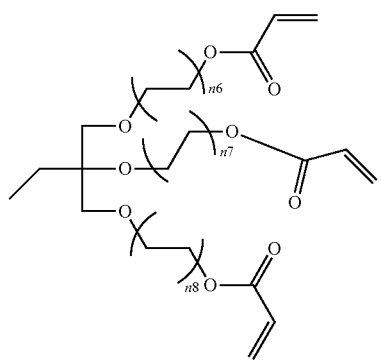

Formula 11

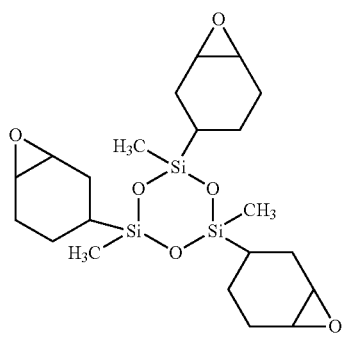

Formula 12

Formula 13

Formula 14

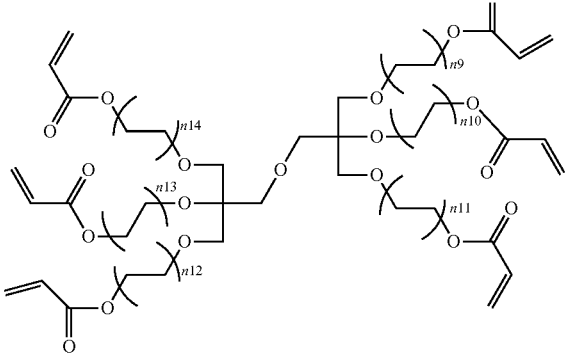

wherein, in Formulas 10 to 14,
n5 is an integer of 1 to 20,
n6 to n8 are each, independently from one another, an integer of 1 to 5, n9 to n14 are each, independently from one another, an integer of 1 to 12, and $R_{31}$ to $R_{38}$ are each, independently from one another, $R_a$ or $R_b$:

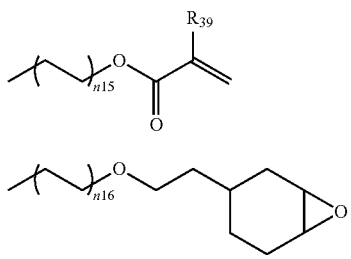

wherein, in $R_a$ and $R_b$, n15 and n16 are each, independently from one another, an integer of 1 to 12, and $R_{39}$ is a hydrogen atom or a methyl group.

19. The display device of claim 1, further comprising a functional layer disposed on the anti-reflection member and containing a compound comprising a fluorine atom.

20. A display device comprising at least one display panel, the at least one display panel comprising:
a light emitting element layer;
an encapsulation layer disposed on the light emitting element layer;
a color control layer directly disposed on the encapsulation layer and including at least one quantum dot;
a color filter layer disposed on the color control layer; and
an anti-reflection member disposed on the color filter layer, the anti-reflection member comprising:
a first coating layer disposed on the color filter layer;
a second coating layer disposed on the first coating layer; and
an inorganic film disposed between the first coating layer and the second coating layer,
wherein the second coating layer has a thickness of about 0.6 times to about 2.0 times greater than the inorganic film, and the first coating layer has a greater thickness than the second coating layer and the inorganic film.

21. The display device of claim 20, wherein the at least one display panel comprises two or more display panels, the two or more display panels being disposed adjacent to each other on a plane, and a minimum distance between the display panels adjacent to each other on a plane is about 30 μm or less.

22. The display device of claim 20, wherein the at least one display panel further comprises a substrate disposed between the color filter layer and the anti-reflection member.

23. The display device of claim 20, wherein the inorganic film comprises a first sub-inorganic film disposed on the first coating layer and a second sub-inorganic film disposed between the first sub-inorganic film and the second coating layer,
a refractive index of the first sub-inorganic film is equal to or greater than about 1.6 and equal to or smaller than about 1.8, and
the refractive index of the second sub-inorganic film is greater than about 1.8 and equal to or smaller than about 2.2.

24. A display device comprising:
a light emitting element layer;
a color control layer disposed on the light emitting element layer and including at least one quantum dot;
a color filter layer disposed on the color control layer; and
an anti-reflection member disposed on the color filter layer, wherein the anti-reflection member comprising:
a first coating layer disposed on the color filter layer;
a second coating layer disposed on the first coating layer; and
an inorganic film disposed between the first coating layer and the second coating layer,
wherein the first coating layer and the second coating layer each, independently from one another, including at least one repeat unit among first to fourth repeat units:

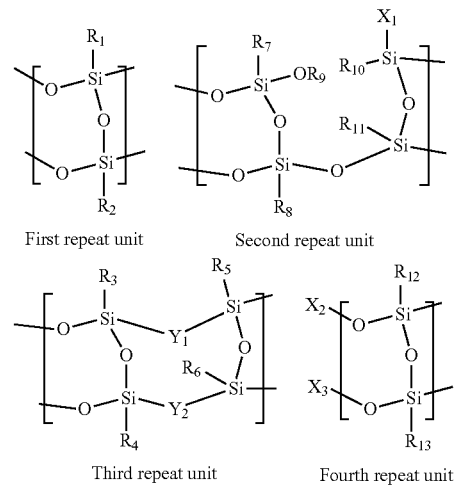

wherein, in the third repeat unit,
at least one of $Y_1$ or $Y_2$ is $[SiO_{3/2}R_{21})_{4+2n}O]$ and the other is O or $NR_{22}$,
in the second repeat unit,
$X_1$ is $[((SiO_{3/2}R_{23})_{4+2m}O]$ or $R_{24}$,
in the fourth repeat unit,
$X_2$ and $X_3$ are each, independently from one another, $[(SiO_{3/2}R_{25})_{4+2j}O]$ or $R_{26}$,
and in the first to fourth repeat units,
$R_{21}$ to $R_{26}$ are each, independently from one another, a substituted or unsubstituted alkyl group having 1 to 12 carbon atoms,
j, n and m are each, independently from one another, an integer of 1 to 20, and
$R_1$ to $R_{13}$ are each independently a hydrogen atom, a deuterium atom, a halogen atom, an isocyanate group, a cyano group, a nitro group, a substituted or unsubstituted amine group, a substituted or unsubstituted epoxy group, a substituted or unsubstituted acrylic group, a substituted or unsubstituted oxy group, a substituted or unsubstituted thiol group, a substituted or unsubstituted alkyl group having 1 to 12 carbon atoms, a substituted or unsubstituted heterocycloalkyl group having 3 to 12 ring-forming carbon atoms, a substituted or unsubstituted alkenyl group having 2 to 12 carbon atoms, a substituted or unsubstituted aryl group having 6 to 12 ring-forming carbon atoms, or a substituted or unsubstituted heteroaryl group having 2 to 12 ring-forming carbon atoms.

25. The display device of claim 24, wherein the first coating layer and the second coating layer each have a smaller refractive index than the inorganic film.

26. The display device of claim 24, wherein the inorganic film comprises at least one of a silicon nitride, a silicon oxynitride, or a titanium dioxide.

27. The display device of claim 24, wherein the inorganic film comprises a first sub-inorganic film disposed on the first coating layer and a second sub-inorganic film disposed between the first sub-inorganic film and the second coating layer,
    wherein the first sub-inorganic film has a smaller refractive index than the second sub-inorganic film.

\* \* \* \* \*